(12) United States Patent
Degner et al.

(10) Patent No.: US 9,176,548 B2
(45) Date of Patent: Nov. 3, 2015

(54) COMPUTER SYSTEM

(71) Applicant: Apple Inc., Cupertino, CA (US)

(72) Inventors: Brett W. Degner, Menlo Park, CA (US); David H. Narajowski, Los Gatos, CA (US); Eric R. Prather, Santa Clara, CA (US); Mark K. Sin, Santa Clara, CA (US); Paul A. Baker, Los Altos, CA (US); Eugene A. Whang, San Francisco, CA (US); Christopher J. Stringer, Woodside, CA (US); Frank F. Liang, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/297,572

(22) Filed: Jun. 5, 2014

(65) Prior Publication Data

US 2014/0362519 A1 Dec. 11, 2014

Related U.S. Application Data

(60) Provisional application No. 61/832,698, filed on Jun. 7, 2013, provisional application No. 61/832,709, filed on Jun. 7, 2013, provisional application No. 61/832,695, filed on Jun. 7, 2013, provisional application No. 61/832,633, filed on Jun. 7, 2013.

(51) Int. Cl.
*G06F 1/20* (2006.01)
*H05K 7/20* (2006.01)
(Continued)

(52) U.S. Cl.
CPC ............... *G06F 1/20* (2013.01); *G02B 6/0001* (2013.01); *G06F 1/181* (2013.01); *G06F 1/182* (2013.01);
(Continued)

(58) Field of Classification Search
CPC .............. H05K 7/20136–7/20172; H06F 1/20; H06F 2200/201; H06F 1/183; H06F 1/182; H06F 1/181
USPC ........................ 361/679.46–679.54, 688–723; 165/80.3, 185; 174/547, 548, 16.1, 174/16.3; 454/184
See application file for complete search history.

(56) References Cited

U.S. PATENT DOCUMENTS

| 4,528,615 | A | * | 7/1985 | Perry ............................ 361/722 |
| 5,912,802 | A | | 6/1999 | Nelson |

(Continued)

FOREIGN PATENT DOCUMENTS

| CN | 201926963 | 8/2011 |
| CN | 202486681 | 10/2012 |

(Continued)

OTHER PUBLICATIONS

PCT Application No. PCT/US2014/041160—International Search Report and Written Opinion dated Oct. 1, 2014.
(Continued)

*Primary Examiner* — Zachary M Pape
(74) *Attorney, Agent, or Firm* — Downey Brand LLP

(57) ABSTRACT

A desktop computing system having at least a central core surrounded by housing having a shape that defines a volume in which the central core resides is described. The housing includes a first opening and a second opening axially displaced from the first opening. The first opening having a size and shape in accordance with an amount of airflow used as a heat transfer medium for cooling internal components, the second opening defined by a lip that engages a portion of the airflow in such a way that at least some of the heat transferred to the air flow from the internal components is passed to the housing.

21 Claims, 12 Drawing Sheets

(51) Int. Cl.
*G06F 1/18* (2006.01)
*G08B 5/36* (2006.01)
*G08B 21/18* (2006.01)
*H05K 5/03* (2006.01)
*F21V 8/00* (2006.01)
*G06F 3/00* (2006.01)

(52) U.S. Cl.
CPC ............... *G06F 1/183* (2013.01); *G06F 1/185* (2013.01); *G06F 1/188* (2013.01); *G06F 3/00* (2013.01); *G08B 5/36* (2013.01); *G08B 21/18* (2013.01); *H05K 5/03* (2013.01); *H05K 7/20145* (2013.01); *H05K 7/20163* (2013.01); *H05K 7/20172* (2013.01)

(56) References Cited

U.S. PATENT DOCUMENTS

| | | | |
|---|---|---|---|
| 6,373,697 | B1 | 4/2002 | Lajara et al. |
| 6,459,577 | B1 * | 10/2002 | Holmes et al. ............... 361/690 |
| 7,180,736 | B2 * | 2/2007 | Glovatsky et al. ............ 361/688 |
| 7,367,384 | B2 | 5/2008 | Madara et al. |
| 7,492,590 | B2 | 2/2009 | Chen et al. |
| 7,679,908 | B2 * | 3/2010 | Yeh et al. ...................... 361/695 |
| 7,742,298 | B2 * | 6/2010 | Kunz ............................. 361/690 |
| 8,279,597 | B2 * | 10/2012 | El-Essawy et al. ...... 361/679.49 |
| 8,687,363 | B2 * | 4/2014 | Moore .......................... 361/690 |
| 2002/0170905 | A1 | 11/2002 | Peterson et al. |
| 2004/0095719 | A1 | 5/2004 | Rong-Yao |
| 2005/0286226 | A1 * | 12/2005 | Ishii et al. .................... 361/697 |
| 2008/0019092 | A1 | 1/2008 | Chen et al. |
| 2009/0059516 | A1 | 3/2009 | Lai et al. |
| 2010/0002383 | A1 | 1/2010 | Yeh et al. |
| 2010/0172084 | A1 | 7/2010 | Winokur |
| 2011/0022770 | A1 | 1/2011 | Sullivan |
| 2011/0093729 | A1 | 4/2011 | Mucignat et al. |
| 2011/0102991 | A1 | 5/2011 | Sullivan |
| 2011/0122566 | A1 | 5/2011 | Hsieh et al. |
| 2011/0122576 | A1 | 5/2011 | Kuo et al. |
| 2011/0299239 | A1 | 12/2011 | Santos |
| 2012/0106064 | A1 | 5/2012 | Li et al. |
| 2012/0211211 | A1 | 8/2012 | Shih |
| 2012/0314373 | A1 * | 12/2012 | Park ............................. 361/715 |
| 2013/0083478 | A1 | 4/2013 | Lin |
| 2013/0088829 | A1 | 4/2013 | Co |
| 2014/0321046 | A1 * | 10/2014 | Sinha et al. ............. 361/679.33 |

FOREIGN PATENT DOCUMENTS

| | | |
|---|---|---|
| EP | 1065752 | 1/2001 |
| EP | 1478020 | 11/2004 |

OTHER PUBLICATIONS

PCT Application No. PCT/US2014/041153—International Search Report and Written Opinion dated Oct. 15, 2014.
Dell Precision Workstation M6500 Service Manual, ftp://ftp.dell.com/Manuals/all-products/esuprt_laptop/esuprt_precision_mobile/precision-m6500_service%20manual_en-us.pdf, Mar. 2010.
Shrout, "BFG Technologies GeForce 7900 GT OC Review," BFG Tech, http://www.pcper.com/reviews/Graphics-Cards/BFG-Technologies-GeForce-7900-GT-0C-Review/Card-and-Features, May 2006.
PCT Application No. PCT/US2014/041165—International Search Report and Written Opinion dated Sep. 29, 2014.
Chinese Patent for Utility Model No. ZL201420297132.0—Evaluation Report for Utility Model Patent dated Dec. 3, 2014.
Seguin, "Computer Shaped Like a Tube: a Nettop by CLVE." Tomsguide.com. http://www.tomsguide.com/us/CLVE-TVBE-Nettop,news-2860.html, Oct. 2008.
FIC Piston Won Best Choice of Computex Taipei 2005, First International Computers, Inc., http://www.fic.com.tw/press.aspx?pr_id=146, May 2005.

* cited by examiner

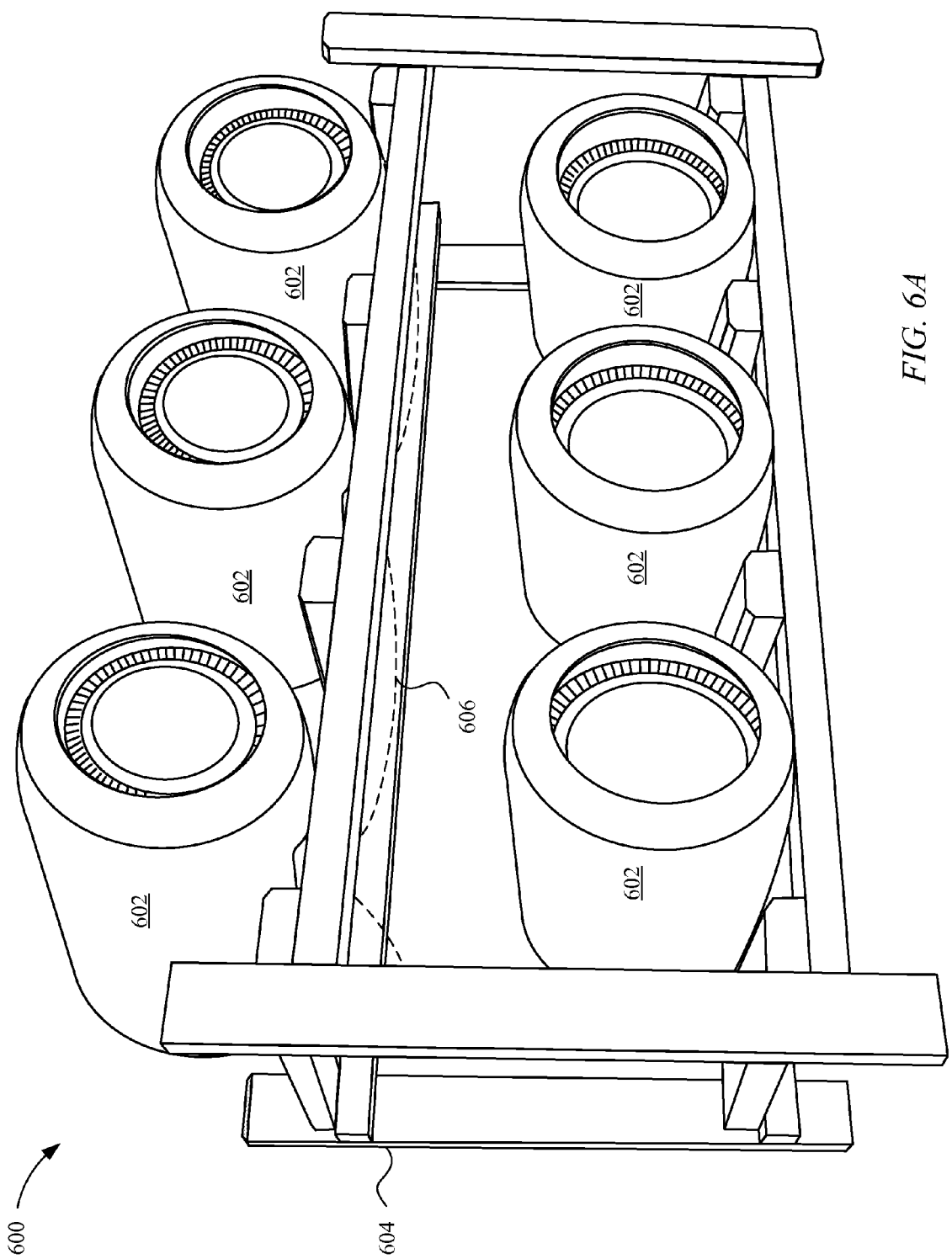

US 9,176,548 B2

COMPUTER SYSTEM

CROSS REFERENCE TO RELATED APPLICATIONS

This application claims the benefit of priority under 35 U.S.C §119(e) to:

(i) U.S. Provisional Application No. 61/832,698 filed on Jun. 7, 2013 and entitled "COMPUTER ARCHITECTURE RESULTING IN IMPROVED COMPONENT DENSITY AND THERMAL CHARACTERISTICS";

(ii) U.S. Provisional Application No. 61/832,709 filed on Jun. 7, 2013 and entitled "INTERNAL COMPONENT AND EXTERNAL INTERFACE ARRANGEMENT FOR A COMPACT COMPUTING DEVICE";

(iii) U.S. Provisional Application No. 61/832,695 filed Jun. 7, 2013 and entitled "ENCLOSURE/HOUSING FEATURES OF A COMPUTER FOR IMPROVED THERMAL PERFORMANCE AND USER EXPERIENCE"; and (iv) U.S. Provisional Application No. 61/832,633 filed Jun. 7, 2013, entitled "THERMAL PERFORMANCE OF A COMPACT COMPUTING DEVICE", each of which is incorporated herein by reference in its entirety for all purposes.

This application is related to:

(i) International Patent Application No. PCT/US2014/041165 filed Jun. 5, 2014 and entitled "COMPUTER SYSTEM";

(ii) International Patent Application No. PCT/US2014/041160 filed Jun. 5, 2014 and entitled "COMPUTER THERMAL SYSTEM"; and (iii) PCT International Patent Application No. PCT/US2014/041153, filed Jun. 5, 2014, entitled "COMPUTER INTERNAL ARCHITECTURE", each of which is incorporated herein by reference in its entirety for all purposes.

TECHNICAL FIELD

The embodiments described herein relate generally to compact computing systems. More particularly, the present embodiments relate to organization of structures and components and fabrication of enclosures suitable for compact computing systems such as a desktop computer.

BACKGROUND

The outward appearance of a compact computing system, including its design and its heft, is important to a user of the compact computing system, as the outward appearance contributes to the overall impression that the user has of the compact computing system. At the same time, the assembly of the compact computing system is also important to the user, as a durable assembly will help extend the overall life of the compact computing system and will increase its value to the user.

One design challenge associated with the manufacture of compact computing systems is the design of the outer enclosures used to house the various internal components. This design challenge generally arises from a number of conflicting design goals that include the desirability of making the outer enclosure or housing lighter, thinner, stronger, and aesthetically pleasing. Lighter housings or enclosures tend to be more flexible and therefore have a greater propensity to buckle and bow, while stronger and more rigid enclosures tend to be thicker and carry more weight. Unfortunately, the increased weight of thicker enclosures may lead to user dissatisfaction with respect to the overall appearance in that they may appear heavy and ill suited for placement on a desktop or in a server rack. However, thinner enclosures can be prone to bowing that may damage internal parts or lead to other failures. Furthermore, the overall appearance of the compact computing system must be aesthetically pleasing as few consumers desire to own or use a device that is perceived to be ugly or unsightly. Due to such considerations, compact computing system enclosure materials are typically selected to provide sufficient structural rigidity while also meeting weight constraints as well as cooperate with thermal systems to maintain operational components within acceptable thermal limits while maintaining any aesthetic appeal worked into materials that meet these criteria.

SUMMARY

The present application describes various embodiments regarding systems and methods for providing a lightweight and durable compact computing system.

A desktop computing system includes a housing having a variable wall thickness and having a longitudinal axis and wherein the housing defines and encloses an internal volume that is symmetric about the longitudinal axis and a computational component positioned within the internal volume.

An enclosure for a computer system includes a housing having a housing thickness and having a longitudinal axis and comprises a cross section having a center point at a position on the longitudinal axis and that encloses an internal volume that is symmetric about the longitudinal axis.

An enclosure for a compact computing system having a computational component includes a housing having a longitudinal axis comprising an electrically conductive material that encloses an internal volume that is symmetric about the longitudinal axis, wherein the computational component is located within the internal volume and a base attached to and electrically couples with the housing in a closed configuration that forms an electromagnetic (EM) shield that electromagnetically isolates the internal volume.

A method of indicating movement of a desktop computing system is carried out by detecting the movement of the desktop computing system by a sensor, providing a movement detection signal by the sensor to a processor in accordance with the movement, and altering an operation of the desktop computing system in accordance with the movement.

A network system includes at least two interconnected computing systems each having a shape characterized as having a longitudinal axis and each having a thermal management system, the computing systems being connected together in a manner that allows the thermal management system of each computing system to maintain a pre-determined thermal performance of each computing system within an operating limit during operation of the network system.

An enclosure for a desktop computer system includes a housing having a longitudinal axis and formed of electrically conductive material that encloses and defines an internal volume that is symmetric about the longitudinal axis.

An enclosure for a desktop computing system having a computational component includes a body that encloses an internal volume formed of an electrically conductive material, a base unit and a sensible element that is detectable by a sensing mechanism coupled to the computational component in accordance with a state of the enclosure.

A desktop computing system includes a housing having a longitudinal axis that encloses an internal volume that is symmetric about the longitudinal axis, a heat sink that encloses at least a central thermal zone that is substantially parallel to the longitudinal axis and a computing engine comprising a computational component disposed within the internal volume and carried by and in thermal contact with the heat sink.

An enclosure for a desktop computer system includes a body having a longitudinal axis and formed of electrically conductive material that encloses and defines an internal volume that is symmetric about the longitudinal axis and having a circular cross section comprising a center point positioned on the longitudinal axis.

An enclosure for a compact computing system having a computational component includes a body that encloses and defines a cylindrical volume and comprises an electrically conductive material and a base having a size and shape in accordance with and attached to the cylindrical body in a closed configuration that electrically couples the base and the cylindrical body forming an electromagnetic (EM) shield that electromagnetically isolates the cylindrical volume.

A desktop computing system having a computational component a housing having a longitudinal axis that encloses and defines an internal volume that is symmetric about the longitudinal axis.

Other apparatuses, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The included drawings are for illustrative purposes and serve only to provide examples of possible structures and arrangements for the disclosed inventive apparatuses and methods for providing compact computing systems. These drawings in no way limit any changes in form and detail that may be made to the invention by one skilled in the art without departing from the spirit and scope of the invention. The embodiments will be readily understood by the following detailed description in conjunction with the accompanying drawings, wherein like reference numerals designate like structural elements.

FIG. 6A shows a rack arrangement suitable for supporting a number of the compact computing systems.

In the figures, elements having the same or similar reference numeral have the same or similar function and description.

DETAILED DESCRIPTION

Figure 1:
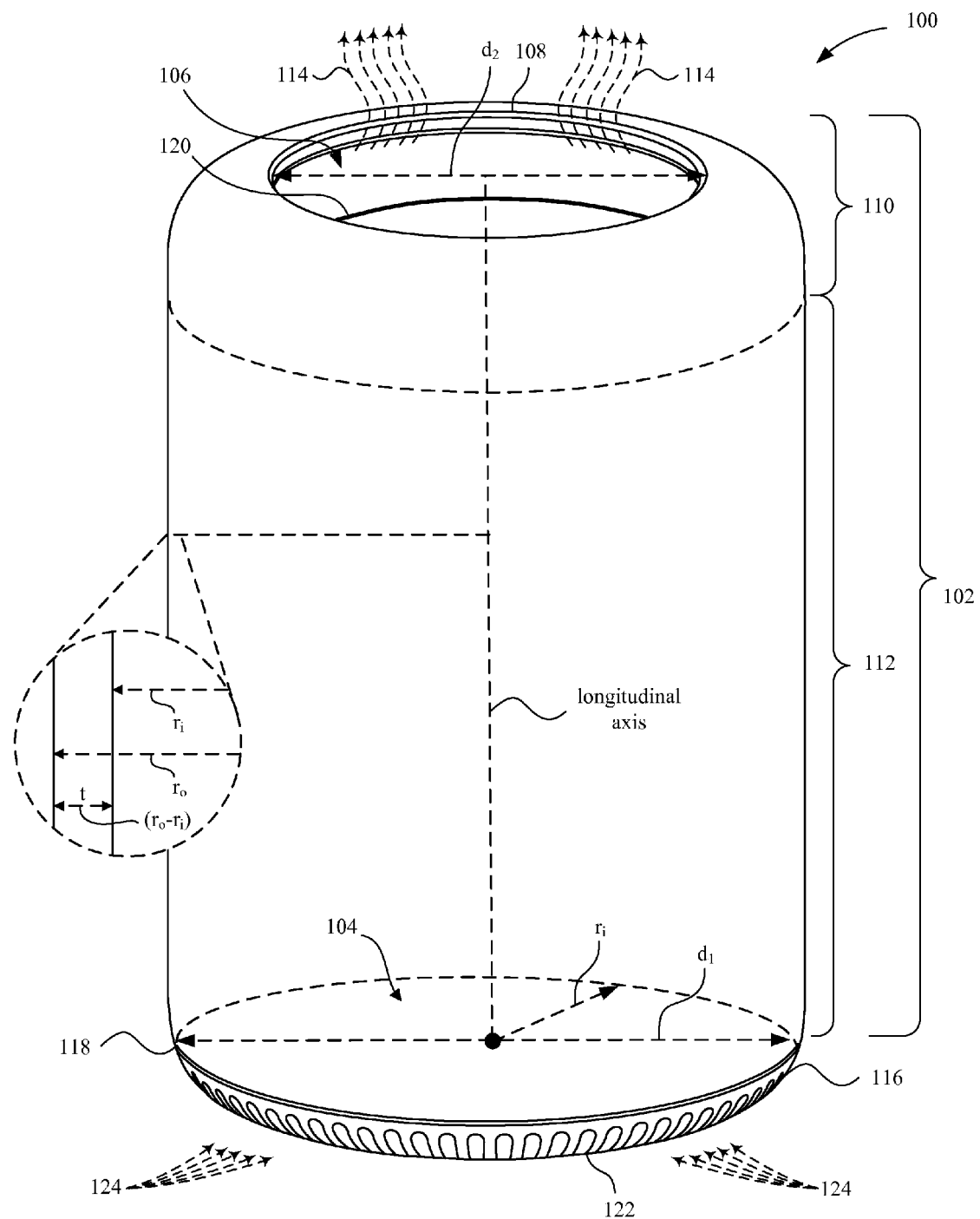
FIG. 1 shows a perspective view of an embodiment of a compact computing system in a stand alone and upright configuration.

Representative applications of apparatuses and methods according to the presently described embodiments are provided in this section. These examples are being provided solely to add context and aid in the understanding of the described embodiments. It will thus be apparent to one skilled in the art that the presently described embodiments can be practiced without some or all of these specific details. In other instances, well known process steps have not been described in detail in order to avoid unnecessarily obscuring the presently described embodiments. Other applications are possible, such that the following examples should not be taken as limiting.

The following relates to a compact computing system that can be configured as a stand-alone unit for placement upon or under a desk or other work area (also referred to as a desktop computer). The compact computing system can also be configured as part of a group of networked or otherwise interconnected computers. In any case, the compact computing system can include a number of electronic components including at least a central processing unit (CPU), and a graphics processing unit (GPU), and other primary and secondary components such a solid state memory devices, wireless components and so on. One or more internal electronic component boards can be shaped to match a surface of the outer enclosure of the compact computing system, including for example, a circular shape to match a top or bottom of a cylinder, or a curved shape to match a segment of an arc conforming to a curved exterior surface of the outer enclosure. In representative embodiments as described herein, the compact computing system can be cylindrical in shape and can be configured to arrange a number of rectangular electronic components as a central core providing a form factor characterized as having a high component packing density (a number of components per available volume). The resulting compact computing device can provide a high computing power density in a small, lightweight, transportable form factor. In some embodiments, the compact computing device can also be coupled to other compact computing devices to form a multi-computer system that can be used as a server computer system (such as in a data farm) or as a network computing system having each compact computing device as a node (or nodes).

For example, in the embodiments described herein, the compact computing system can be cylindrical and be configured in such a way that the rectangular electronic components can be assembled as a central core with a form factor having a high component packing density (number of components per available volume). The central core can also have a cylindrical shape in concurrence with a housing having an annular cylindrical shape along the lines of a tube. A thermal management system can utilize an air mover that can be move copious amounts of air axially through an interior volume defined by the housing that can be used to cool a central core of the compact computing system in a manner that is both efficient and quiet. Generally speaking, the air mover can provide a volume of air per unit time in the form of an airflow of about 15-20 cubic feet per minute (CFM) when major components such as a central processing unit (CPU) and/or a graphics processing unit (GPU) are not being heavily utilized. However, when processing demand increases, the air mover can compensate for any increase in heat generated by ramping up the airflow. For example, in response to an increase in demand for processing resources from either or both the CPU and/or GPU, the air mover can increase the airflow from about 15-20 CFM to about 25-30 CFM (at about room temperature of 25° C.) with an acoustic output of about 35 dbA (it should be noted that these acoustic levels are only experienced when the air mover is performing at a higher end of its operating range during a period of high demand and not during more normal operation). It should be noted that at higher ambient temperature (35° C.), the air mover can ramp the airflow even further to compensate for the reduced thermal transfer at the higher ambient temperature. In this situation, the air mover can ramp the airflow to about 35 to 40 CFM or more having a higher acoustic output of 40 dbA or more.

The air mover can occupy a substantial amount of available cross sectional real estate defined by the housing providing an axial airflow substantially free of radial airflow components. Moreover, components that make up the central core can be aligned in an axial manner that maximizes an amount of surface area in thermal contact with the axial airflow. Furthermore, the design and layout of the components can also be axial in nature further enhancing the available heat transfer capability and component packing density that leads to higher computing power density (computing operations per available volume). For example, an integrated circuit can be designed to have a power input node (s) at a first end of the integrated circuit and data I/Os at an opposite end of the integrated circuit.

The compact computing system can also be coupled to other compact computing systems to form a multi-computer system that can be used as a server computer system (such as in a data farm) or as a network computing system having each compact computing system as a node (or nodes). One advantage of the compact size and shape of the compact computing system is that a simple racking system (along the lines of a wine rack configuration) can be used to position the multiple connected compact computing systems. For example, the individual compact computing systems can be placed at an angle within a rack arrangement in such a way as to provide easy access to inputs as well as outputs for connection to other devices without restricting the flow of air into or out of the compact computing system. In some cases, the individual compact computing systems can be stacked in an alternating arrangement that also does not restrict either air intake or air exhaust. These and other general subjects are set forth in greater detail below.

In a particular embodiment, the compact computing system can include a housing that can surround and protect the central core. The housing can be easily removed for servicing or other access. The housing can be formed of aluminum having an aluminum oxide (alumina) layer that both protects the housing and promotes radiative cooling. The aluminum oxide/anodization layer also improved heat rejection from external surface of the housing by increasing its infrared radiative emissivity. Aluminum has a number of characteristics that make it a good choice for the housing. For example, aluminum is a good electrical conductor that can provide good electrical ground and it can be easily machined and has well known metallurgical characteristics. The superior conductivity of aluminum provides a good chassis ground for internal electrical components arranged to fit and operate within the housing. The aluminum housing also provides a good electromagnetic interference (EMI) shield protecting sensitive electronic components from external electromagnetic energy as well as reducing leakage of electromagnetic (EM) energy from the compact computing system. A layer of aluminum oxide can be formed on the surface of the aluminum in a process referred to as anodization. In some cases, the layer of aluminum oxide can be dyed or otherwise imbued with a color(s) to take on a specific color or colors. It should be noted that since aluminum oxide is a good electrical insulator, either the interior surface of the housing is masked during the anodization process to preserve access to the bulk material or selected portions of the layer of aluminum oxide are removed to provide good electrical contacts.

In one embodiment, the cylindrical housing can take the form of a single piece housing (monolithic). In this way, the cylindrical housing appears seamless and homogenous. The cylindrical shape of the housing maximizes the ratio of internal volume and enclosure volume. In one embodiment, the housing is formed of a single billet of a strong and resilient material such as aluminum that is surface treated (anodized) to provide an aesthetically pleasing appearance. A top portion of the cylindrical housing is formed into the lip used to engage a circumferential portion of the airflow that travels in an axial direction from the first opening to the second opening at which point the airflow passes to an external environment. The lip can also be used to transport the compact computing system using for example, a hand.

In a particular embodiment, a compact computing system can be assembled using a bottom up type assembly. Initial assembly operations can include installing a vapor chamber on each side of a triangular central core structure. In the described embodiments, the vapor chamber can take on the form of a two phase (vapor/solid) heat spreader. In a particular implementation, the core can take the form of an aluminum frame secured to and cradled within a fixture. High power components, such as a graphic processor unit (GPU) and/or central processor unit (CPU) can be mounted directly to the vapor chambers.

A good thermal contact can be formed between the vapor chambers and the high power components using a thermally conductive adhesive, paste, or other suitable mechanism. A main logic board (MLB) can be pressed against a CPU edge connector followed by installation of a GPU flex(es). Once the MLB is seated and connected to the CPU and GPU, memory modules can be installed after which an inlet assembly can be installed and coupled to the core structure using fasteners. An input/output (I/O) assembly that has been independently assembled and pre-tested can be installed after which a power supply unit (PSU) control cable can be connected to the MLB followed by connecting the DC PSU power using a bus bar system. An exhaust assembly can be installed followed by connecting a RF antenna flex to an I/O board.

As noted above, the housing can take on many forms, however, for the remainder of this discussion and without loss of generality, the housing takes on a cylindrical shape that encloses and defines a cylindrical volume. In the described embodiment, the housing and the corresponding cylindrical volume can be defined in terms of a right circular cylinder having a longitudinal axis that can be used to define a height of the right circular cylinder. The housing also can be characterized as having a circular cross section having a center point on the longitudinal axis. The circular cross section can have a radius that extends from the center point and is perpendicular to the longitudinal axis. In one embodiment, a thickness of the housing can be defined in terms of a relationship between an inner radius (extending from the center point to an interior surface of the housing) and an outer radius (extending from the center point to an exterior surface of the housing).

The housing can have a thickness tuned to promote circumferential and axial conduction that aids in the spreading out of heat in the housing thereby inhibiting formation of hot spots. The separation between the central core and the housing allows an internal peripheral airflow to cool the housing helping to minimize a touch temperature of the housing. In one embodiment, the housing can be mated to a base unit that provides, in part, a pedestal used to support the compact computing system on a surface. In one embodiment, the base unit can be a removable base unit. The housing can include a first opening having a size and shape in accordance with the base unit. The first opening can be a full perimeter air inlet whose circular design allows for functionality even in those situations where the compact computing system is located in a corner or against a wall. In an assembled configuration, the base unit corresponds to a base of the cylinder. The first opening can be used to accept a flow of air from an external environment passing through vents in the base unit. The amount of air that flows into the housing is related to a pressure differential between the external environment and an interior of the compact computing system created by an air mover assembly near a second opening axially disposed from the first opening. A thermal management system can utilize the air mover that can be move copious amounts of air axially through an interior volume defined by the cylindrical housing that can be used to cool the central core in a manner that is both efficient and quiet.

In one embodiment, an air exhaust assembly can take the form of a fan assembly. The fan assembly can be an axial fan assembly configured to axially move air through the housing by creating the abovementioned pressure differential. The fan assembly can also be configured as a mixed air fan assembly providing both axial and centrifugal components to air as it exits the fan assembly. In one embodiment, the fan assembly can occupy a substantial portion of available cross sectional area of the cylindrical housing. For example, the fan assembly can account for at least 85% or thereabouts of an available cross sectional area of an interior of the housing. In any case, air can enter through the vents in the base unit. In one embodiment, a baffle arrangement can bifurcate (split) the airflow in such a way that some of the airflow remains within a central column separate from a peripheral airflow located away from the central column. The central column of air can thermally engage a heat sink structure on which internal components can be mounted. In order to optimize thermal transfer, components can be configured and mounted axially (in the direction of air flow) in order to maximize an amount of air engaging the components. In this way, both the central airflow and the peripheral airflow can be used to cool the central core and still maintain the housing at an acceptable temperature.

The housing can include an exhaust lip at the second opening. The exhaust lip can be arranged to engage a portion of the air as it flows out of the second opening having the effect of directing the airflow (and sound) away from the user. The exhaust lip can also provide an integrated handle structure suitable for grasping the compact computing system. The housing can have a thickness that is tuned by which it is meant that the housing has a varying thickness in which a portion of the housing nearest the exhaust lip is thicker than that portion away from the exhaust lip. The thickness of the housing can be varied in a manner that promotes an axial and circumferential conduction of heat in the housing that promotes a more even distribution of heat that inhibits the formation of hot spots in the housing.

A good electrical ground (also referred to as a chassis ground) can be used to isolate components that emit significant electromagnetic energy (such as a main logic board, or MLB) from those circuits, such as wireless circuits, that are sensitive to electromagnetic energy. This isolation can be particularly important in the compact computing system due to the close proximity of components that emit electromagnetic energy and those components that are sensitive to electromagnetic energy. Moreover, the housing can include conductive material (such as a gasket infused with conductive particles) that can be mated to a corresponding attachment feature on the base unit completing the formation of a Faraday cage. The Faraday cage can block electromagnetic energy (both internal and external) effectively shielding the external environment from EMI generated by the compact computing system (and the internal environment from externally generated EMI). In order to complete the Faraday cage, air vents in the base unit can be sized to effectively block electromagnetic energy having selected wavelength. More specifically, the wavelength of electromagnetic energy blocked by the vents can be consistent with that emitted by active components with the compact computing system.

In one embodiment, the compact computing system can include a sensor configured to detect whether or not the housing is properly in place and aligned with respect to the internal components. Proper placement of the housing is important due to the key role that both the shape and configuration of the housing has with respect to thermal management of the compact computing system as well as completing the Faraday cage discussed above. The compact computing system can include an interlock system that detects the presence and proper alignment of the housing with respect to the internal components. Only when the proper alignment is detected, the interlock system will allow the internal components to power up and operate in a manner consistent with system specification. In one embodiment, the interlock system can include a magnetic element detectable by a Hall effect sensor only when the housing is in a proper position and alignment with respect to the internal components.

Due at least to the strong and resilient nature of the material used to form the housing; the housing can include a large opening having a span that does not require additional support structures. Such an opening can be used to provide access to an input/output panel and power supply port. The input/output panel can include, for example, data ports suitable for accommodating data cables configured for connecting external circuits. The opening can also provide access to an audio circuit, video display circuit, power input, etc. In one embodiment, selected data ports can be illuminated to provide easier access in reduced lighting.

These and other embodiments are discussed below with reference to FIGS. 1-8. However, those skilled in the art will readily appreciate that the detailed description given herein with respect to these figures is for explanatory purposes as the invention extends beyond these limited embodiments.

FIG. 1 shows a perspective view of compact computing system 100. Compact computing system 100 can have a shape defined by housing 102. In the described embodiments, housing 102 can be cylindrical in shape having a first opening 104 characterized as having diameter $d_1$. More specifically, housing 102 can take the form of a circular right cylinder having a longitudinal axis that extends long a centerline of a central volume enclosed by housing 102. Housing 102 can be characterized as having a circular cross section having a center point coincident with a corresponding point on the longitudinal axis. The circular cross section has a radius that is perpendicular to the longitudinal axis and extends outwardly therefrom. Accordingly, thickness t of housing 102 (more specifically a housing wall) can be defined as a difference between an outer radius $r_o$ associated with an exterior of housing 102 and inner radius $r_i$ associated with an interior surface of housing 102. Moreover, housing 102 can include a second opening 106 axially disposed from first opening 104 having diameter $d_2$ defined in part by exhaust lip 108 where $d_1$ is at least equal to or greater than $d_2$. Housing 102 can be formed from a single billet of aluminum in the form of a disk that can be extruded in a manner forming exhaust lip 108. Thickness t of housing 102 can be tuned to mitigate hot spots. In this regard, housing 102 can have a non-uniform thickness t. In particular, portion 110 near exhaust lip 108 can have a first thickness of about 4-6 mm that then changes to a second thickness associated with portion 112 that is reduced from the first thickness and located away from exhaust lip 108. In this way, portion 110 can act as both an integrated handle used to grasp compact computing system 100 and as a feature that absorbs and conducts thermal energy transferred from a portion of exhaust airflow 114 that engages exhaust lip 108. Through radiative and conductive heat transfer and by limiting the amount of heat transferred to portion 112, the formation of local hot spots in housing 102 can be mitigated. Tuning the thickness of housing 102 can be accomplished using, for example, an impact extrusion process using a metal disk that is then machined to the desired thickness profile. The metal disk may be made of aluminum, titanium, and any other metallic material that provides the strength, thermal conductivity, and RF-isolation desired. The extrusion process forms a cylinder that is machined in the exterior portion and in the interior portion to acquire the desired cross sectional profile and also the desired visual appeal from the exterior.

Compact computing system 100 can further include base unit 116. Base unit 116 can be used to provide support for compact computing system 100. Accordingly, base unit 116 can be formed of strong and resilient material along the lines of metal that can also prevent leakage of electromagnetic (EM) energy from components within compact computing system 100 that radiate EM energy during operation. Base unit 116 can also be formed of non-metallic compounds that can nonetheless be rendered electrically conductive using, for example, electrically conductive particles embedded therein. In order to assure that any electromagnetic energy emitted by components within compact computing system 100 does not leak out, lower conductive gasket 118 can be used to complete a Faraday cage formed by base unit 116 and housing 102. Upper conductive gasket 120 (shown in more detail in FIG. 3) can be disposed on the interior surface of housing 102 near a lower edge of portion 110. Use of conductive gaskets 118 and 120 to complete the Faraday cage can increase EMI isolation by about 20 dB.

Base unit 116 can also include vents 122. Vents 122 can be dual purpose in that vents 122 can be arranged in base unit 116 in such a way that a suitable amount of air from an external environment can flow through vents 122 in the form of intake airflow 124. In one embodiment, intake airflow 124 can be related to a pressure differential across vents 122 created by an air mover disposed with compact computing system 100. In one embodiment, the air mover can be disposed near second opening 106 creating a suction effect that reduces an ambient pressure within housing 102. In addition to facilitating intake airflow 124, vents 122 can be sized to prevent leakage of electromagnetic energy there through. The size of vents 122 can be related to a wavelength corresponding to electromagnetic energy emitted by internal components.

It should be noted that although a cylindrical housing is shown, that nonetheless any suitably shaped housing can be used. For example, housing 102 can be have a rectangular cross section, a conical cross section (of which the circle is only one), or the cross section can take the form of an n-sided polygon (of which the rectangle is one in which n=4 and a triangle where n =3) where n is an integer having a value of at least 3.

Figure 2:
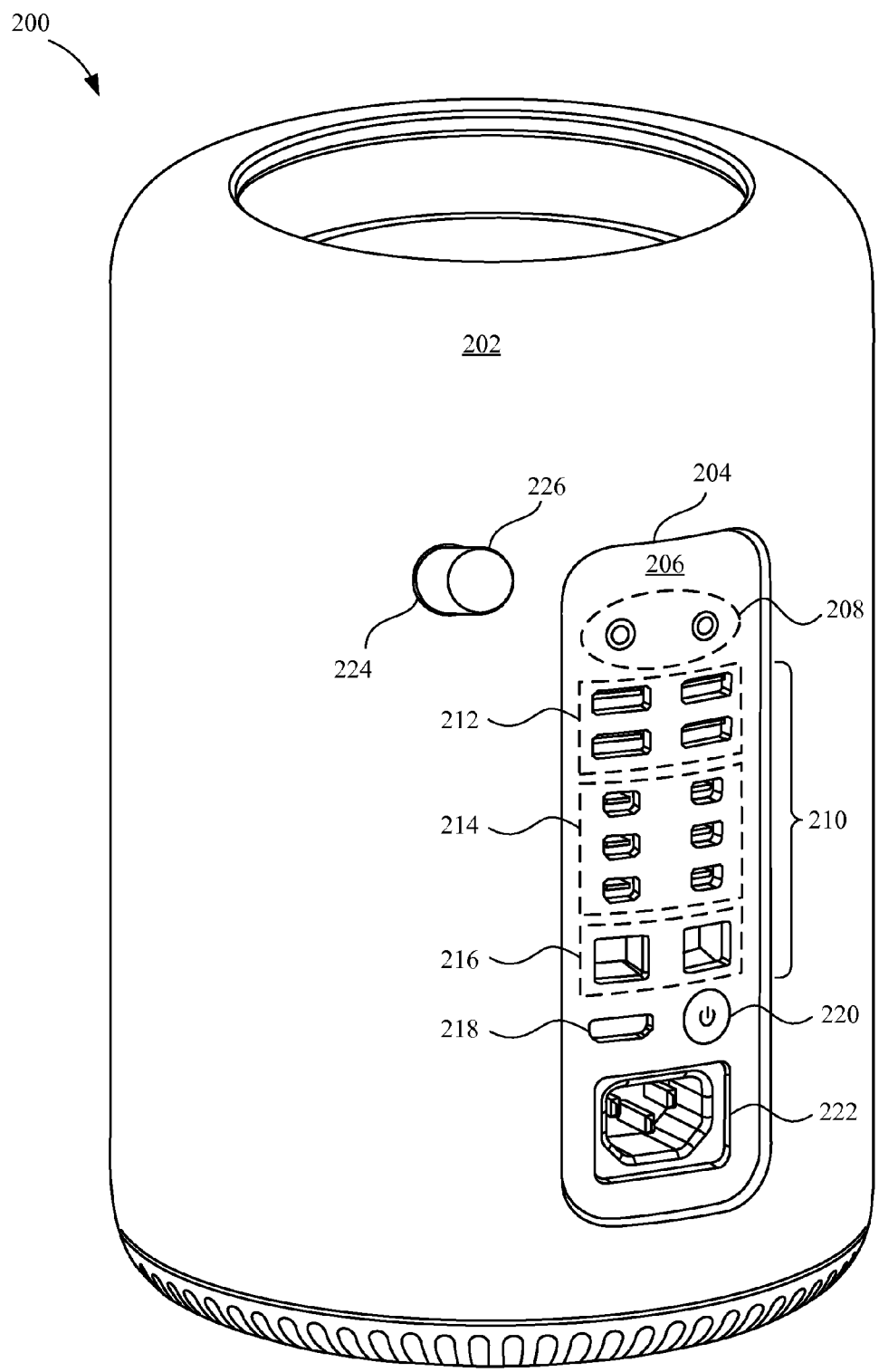
FIG. 2 shows a perspective view of another embodiment of a compact computing system in accordance with the described embodiments.

FIG. 2 shows another embodiment of compact computing system 100 in the form of compact computing system 200. It should be noted that compact computing system 200 can be substantially the same or similar as compact computing system 100 with respect to size and shape of housing 102. Compact computing system 200 can include housing 202 that can differ from housing 102. In this embodiment, housing 202 can include opening 204 having a size and shape in accordance with interface panel 206. Interface panel 206 can include various ports used for communication of data between compact computing system 200 and various external circuits. For example, interface panel 206 can include audio jack ports 208 that can be used to provide an audio stream to an external audio circuit, such as a headphone circuit, audio processor, and the like. A set of data ports 210 can be used to transfer data of various forms and/or power between an external circuit(s) and compact computing system 200. Data ports 210 can be used to accommodate data connections such as USB, Thunderbolt®, and so on. For example, the set of data ports 210 can include data ports 212 in the form of USB ports whereas data ports 214 can take the form of Thunderbolt® ports. In this way, compact computing system 200 can be interconnected to other computing systems such as data storage devices, portable media players, and video equipment, as well as to form a network of computing systems. Furthermore, data ports 216 can take the form of Ethernet ports suitable for forming communication channels to other computing systems and external circuits whereas data port 218 in the form of an HDMI port can be used for audio/video (AV) data transport. In this way, data port 218 can be used to stream high speed video between compact computing system 200 and an external video monitor or other video processing circuitry. Accordingly, interface panel 206 can be used to form connections to a large number and variety of external computing systems and circuits which is particularly useful in those situations where a large amount of computing resources are required without the high capital costs associated with large mainframe type computers. Moreover, the compact size and shape of compact computing system 200 also lends itself to space efficient computing networks, data farms, and the like.

Interface panel 206 can be made of a non-conductive material to electrically insulate each of the ports from one another and from housing 202. Accordingly, interface panel 206 may include a plastic inlay dyed to provide a cosmetic appeal to computing system 200. For example, in some embodiments interface panel 206 is dyed with a black or dark tint. Below the surface of interface panel 206, a conductive web supported by a conductive gasket maintains a Faraday cage for RF and EMI insulation formed between housing 202 and upper and lower conductive gaskets (118, 120) located at an interior surface of housing 202. Power on/off button 220 can be readily available to accept a user touch for initiating a power on sequence (including, for example, boot up process) as well as a power down sequence. Power input port 222 can be sized and shaped to accept a power plug suitable for transferring external power to operational components within housing 202. In some cases, compact computing system 200 can include internal power resources (such as a battery) that can be charged and re-charged in accordance with power delivered by way of power input port 222.

Housing interlock opening 224 can be accommodate housing interlock 226 used to secure housing 202 to internal structures of compact computing system 200. Housing interlock 226 can take the form of a sliding latch or other such mechanism that can be manually engaged and disengaged. In this way, housing 202 can be easily removed in order to expose internal components and structures for servicing, for example. It should be noted that although not shown, a detection circuit can be used to detect if housing 202 is properly in place with respect to internal components and structures. This is particularly important since thermal management of compact computing system 200 relies to a large degree on the presence and proper placement of housing 202. Therefore, it is desired that if it is determined that housing 202 is not in proper placement or alignment with respect to internal structures or components, then the detection circuit will prevent compact computing system 200 from operating, or at least operating at full capacity. In one embodiment, the detection circuit can include a magnetic sensor (such as a Hall Effect device) located to detect a magnet(s) disposed on housing 202 only when housing 202 is properly placed and aligned.

Figure 3:
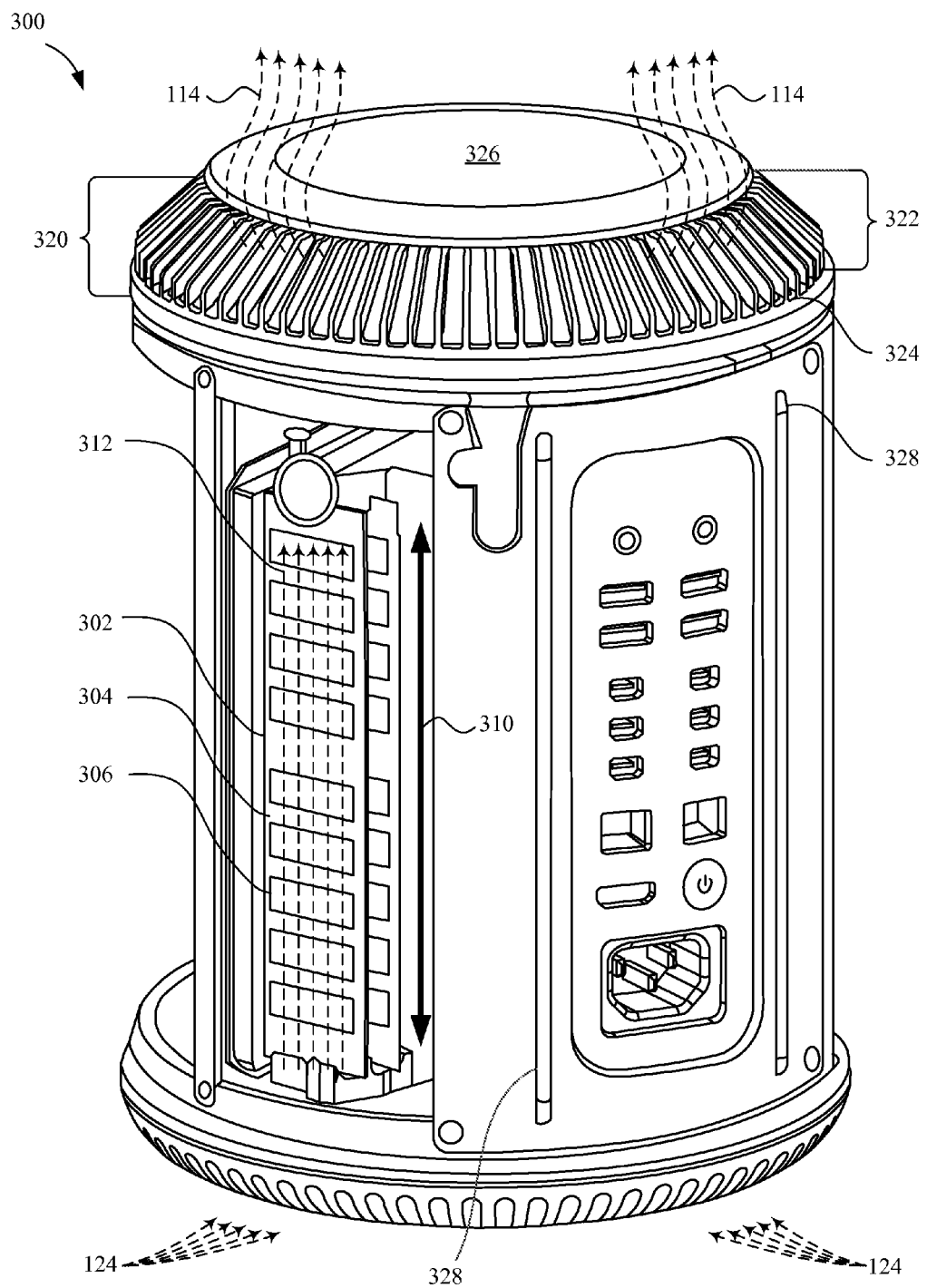
FIG. 3 shows a perspective view of a general system layout of the compact computing system of FIG. 2.

Removing housing 202 can expose a central core of compact computing system 200. More specifically, FIG. 3 shows central core 300 of compact computing system 200 absent housing 202. Central core 300 can include a computing engine having computational components and a heat sink that can be used as a framework used to support at least some of the computational components. In this way, the computing engine takes on a form factor in accordance with that of the heat sink. Accordingly, the cylindrical shape of compact computing system 200 dictates the arrangement of various internal components as well as requirements for thermal management. For example, internal components can be arranged in an axial manner that optimizes both a component packing density (the number of operational components per available volume) and a computing power density (computing power per available volume). Moreover, the axial arrangement of internal components also optimizes an amount of heat that can be transferred to intake airflow 124 from the internal components and removed by way of exhaust airflow 114. (It should be noted that, in general, the nature of compact computing system 200 provides that intake airflow 124 be about the same as that of exhaust air flow 114.)

For example, memory module 302 can be formed of substrate 304 on which is mounted memory device 306. Substrate 304 can have major axis 310 that is parallel to peripheral airflow 312. In order to optimize heat transfer from memory device 306 to peripheral airflow 312, memory device 306 can be mounted onto substrate 304 in a manner that maximizes a thermal transfer interface with peripheral airflow 312. For example, each memory device can have a shape corresponding to a minor dimension (representing a width W, for example) and a major dimension (represented by a length L, for example). In the embodiment shown, the minor dimension W of memory device 306 is aligned generally parallel to peripheral airflow 312. In this way, a thermal transfer interface formed between peripheral airflow 312 and memory device 306 disposed on memory module 302 can be optimized. It should also be noted that peripheral airflow 312 is constrained by the presence of housing 202 to flow in a peripheral region defined by an interior surface of housing 202 and central core 300. Moreover, peripheral airflow 312 can be characterized as having substantially no radial components thereby further enhancing the heat transfer capability of peripheral airflow 312 with respect to memory module 302 and memory device 306. In this way, the axial components of peripheral airflow 312 align with the minor dimension W of memory device 306. It should be noted that intake airflow 124 is split into peripheral airflow 312 and central airflow 314 (not shown) that flows within a central portion of the central core 300. Accordingly, peripheral airflow 312 and central airflow 314 are combined forming exhaust airflow 114 prior to passing out of compact computing system 200 through second opening 106.

In the described embodiment, air mover 320 can be disposed in proximity to second opening 106 (cf. FIG. 1). It should be noted that air mover 320 can combine the central airflow 314 and peripheral airflow 312 back into exhaust airflow 114. Air mover 320 could include air exhaust assembly 322 that can be used to direct exhaust airflow 114 through second opening 106 at least some of which engages with exhaust lip 108 in a manner that facilitates the transfer of thermal energy generated by internal components of compact computing system 200. Air exhaust assembly 322 includes vents 324 to allow exhaust airflow 114 to pass through. Cosmetic shield 326 can be used to cover operational components such as RF circuits and antenna. In this regard, cosmetic shield 326 can be formed of RF transparent material such as plastic, ceramic, or other non-conductive materials.

Due to the electrically conductive nature of housing 202, housing 202 can be used as a chassis ground to provide a good ground for internal components. Accordingly, touch points 328 can be formed of conductive material and be used to form a conductive path between internal components and an interior of housing 202. It should be noted that in order to make a good electrical connection, portions of housing 202 contacting touch points 328 are devoid of any non-conductive or insulating material (such as aluminum oxide). Therefore, in those cases where housing 202 has an aluminum oxide layer formed thereon, selected portions of the aluminum oxide are removed (or that portion of housing 102 masked during the anodization operation) to expose bulk material in those locations that come into contact with touch points 328. As discussed above, in order to prevent leakage of electromagnetic energy, housing 202 and base unit 116 forms a Faraday cage.

In order to provide a user-friendly interaction with compact computing system 200, central core 300 may include sensors such as accelerometers disposed on a plurality of points. Thus, as the user handles housing 202 in order to position compact computing system 200 in a convenient location and orientation, illumination patterns can be used to highlight aspects of interface panel 206 so as to make portions of interface panel 206 more visible to the user. Accordingly, some of the sensors may include light sensing devices to determine whether or not there is sufficient ambient illumination for the user to see selected items on interface panel 206.

Figure 4A:
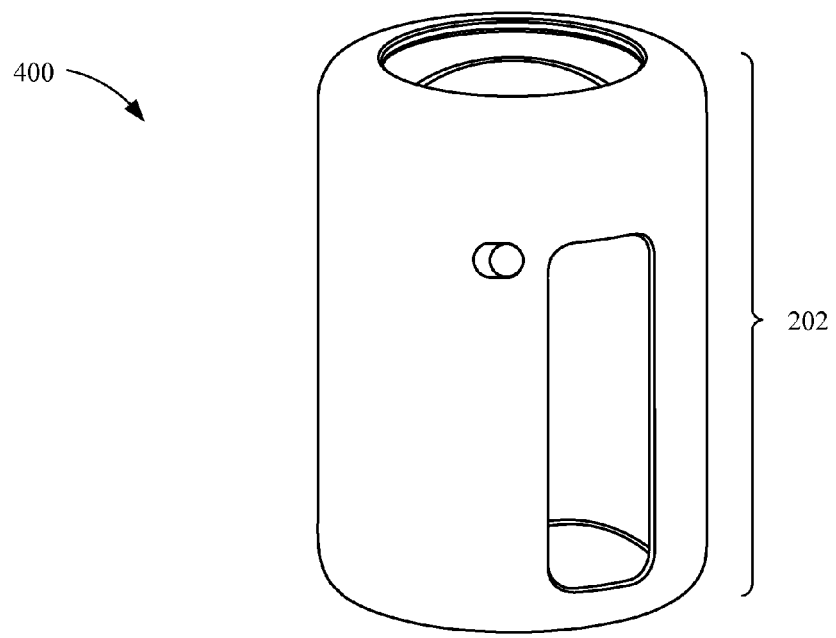
FIG. 4A shows an exploded view of a compact computing system including a housing and a central core, according to some embodiments.
Figure 4A:
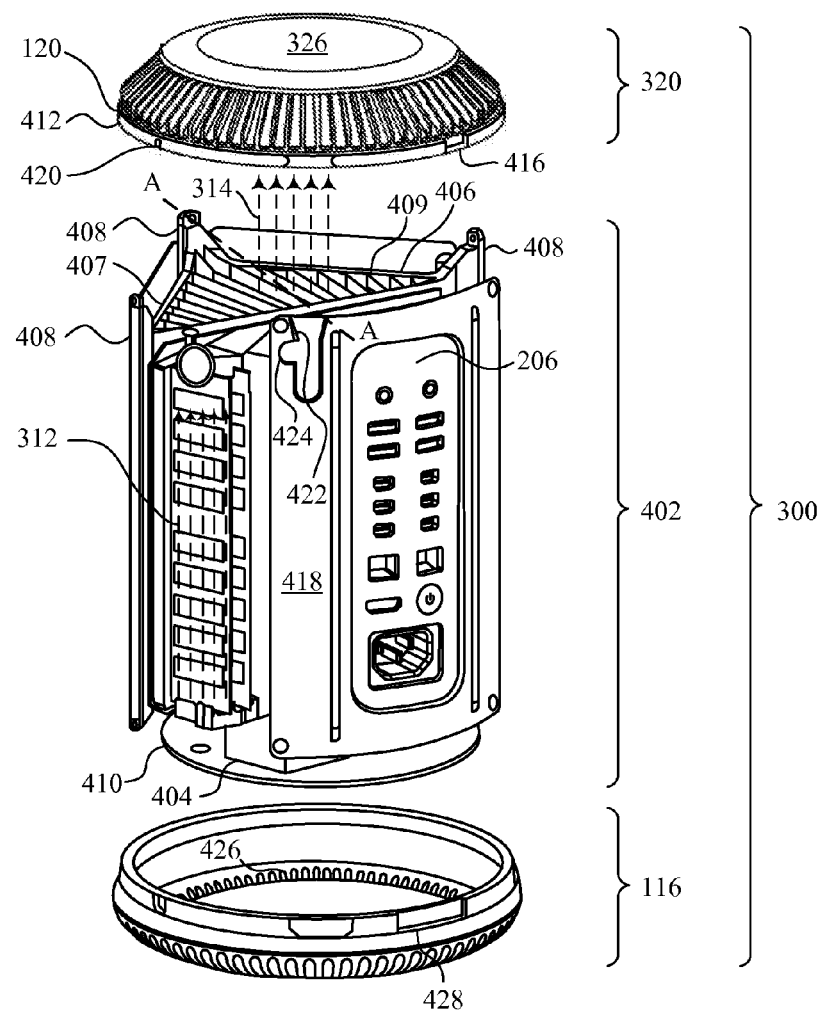

FIG. 4A shows an exploded view 400 of compact computing system 200 including housing 202 and central core 300. Central core 300 includes air mover 320, computing engine 402, and base unit 116. Central core 300 may also include a Power Supply Unit (PSU) 404 coupled to interface panel 206 on the outside surface (facing the user). Computing engine 402 includes heat sink 406 for heat exchange with central air flow 314. Heat sink 406 has a cross section can take the form of an m-sided polygon (of which the rectangle is one in which m=4 and a triangle where m=3) where m is an integer having a value of at least 3 (that may or may not be equal to n), the sides of the polygon forming a base for mounting processor boards such as CPU board and GPU boards. In other words, there are many geometric arrangements and relationships that are suitable between housing 100/102 and the central core 300. Heat sink 406 may also include a plurality of vertical members (or 'stanchions') 408 along the vertex of the polygonal cross section. Vertical members 408 may include attachment features so that a fastener (e.g., through holes for a screw) may attach base unit 116 and air mover 320 to computing engine 402 to form central core 300.

It should be noted that in a specific embodiment, heat sink 406 includes planar faces 407 that define a central thermal zone having a triangular cross section. Heat sink 406 also includes at least one cooling fin 409 that extends longitudinally at least part of a length of a corresponding planar face and spans the central thermal zone. Moreover, a center cooling fin extends from a first planar face to a junction of a second planar face and a third planar face and bisects the central thermal zone into a first region and a second region each having similar triangular cross sections. Furthermore, a first cooling fin different from the central cooling fin extends from the first planar face to the second planar face and spans the first region whereas a second cooling fin different from the first cooling fin and the central cooling fin extends from the first planar face to the third planar face and spans the second region. In the described embodiment, a first angle between the first cooling fin and the first planar face varies in accordance with a distance between the first cooling fin and the center cooling fin and a second angle between the second cooling fin and the first planar face varies in accordance with a distance between the second cooling fin and the center cooling fin such that a summation of the first angle and the second angle is equal to about 180°.

In some embodiments, computing engine 402 includes main logic board (MLB) 410. Accordingly, MLB 410 may be formed in a circular printed circuit board (PCB), on a plane substantially orthogonal to the longitudinal axis of housing 202. Computing engine 402 may have a polygonal cross-section (such as a triangle described above) such that the polygon is inscribed in the circular cross-section of housing 202. For example, as shown in FIG. 4A, computing engine 402 may have a triangular cross section wherein a base of the triangle corresponds with a diameter of the circular cross-section of housing 202 whereas the other two sides of the triangle each form a cord of the circular cross-section of housing 202. Air mover 320 may include surface 412 for electrically coupling to upper conductive gasket 120. Surface 412 can be laser etched to provide a good fit with upper conductive gasket 120 providing a good seal. Thus, RF antennas in the top portion of air mover 320 (enclosed by cosmetic shield 326) are electrically insulated from RF and EMI signals through the bottom side of air mover 320.

Air mover 320 may include an indentation 416 for receiving the top edge of an interface structural wall 418. Air mover 320 also includes a plurality of attachment features 420 for attaching air mover 320 to computing engine 402 (e.g., holes). Interface structural wall 418 supports interface panel 206 (cf. FIG. 2). In order to insulate central core 300 from RF-radiation and EMI, interface structural wall 418 may include a layer of a conductive material, such as aluminum. In that regard, the layer of conductive material in interface structural wall 418 may have a thickness that provides adequate RF and EMI insulation. In some embodiments, structural wall 418 may include an aluminum layer that is no less than 10 μm thick. For example, the thickness of the aluminum layer in interface structural wall 418 may be about 100 μm, or more. Structural wall 418 includes a housing latch lead-in feature 422 and a housing latch locking feature 424. Base unit 116 includes ribs 426, and an indentation 428 for receiving the bottom edge of interface structural wall 418. Indentation 428 may be a grooved portion along a top perimeter of base unit 116.

Housing 202 can slide down over central core 300 and stops at base unit 116, completing assembly of compact computing system 200. On the bottom end of housing 202, lower conductive gasket 118 couples housing 202 to base unit 116. In some embodiments, lower conductive gasket 118 can have an outer diameter slightly greater than the inner diameter of housing 202. Thus, once housing 202 is lowered down onto base unit 116, the weight of housing 202 presses onto lower conductive gasket 118 resulting in a concentric bias to housing 202 that also secures housing 202 in position. Once in place, housing 202 causes formation of a peripheral air gap between vents 122 and the inside surface of housing 202.

Housing 202 is an integral part of the thermal management operation of compact computing system 200 by forming in effect a chimney for peripheral airflow 312 (cf. FIG. 3). In some embodiments, housing 202 also provides RF and EMI insulation to electronic components and circuitry in central core 300. In that regard, some embodiments of compact computing system 200 are fully operational once housing 202 is in place. Accordingly, some embodiments may include sensors mounted on central core 300. The sensors may be configured to enable the operation of compact computing system 200 only once housing 202 is secured in place. For example, the sensor may include a Hall effect sensor, the magnet placed in an interior face of housing 202. Thus, when housing 202 is in place, the sensor is engaged and compact computing system 200 is enabled. Further, housing 202 provides a cosmetic profile to compact computing system 200 that makes it appealing for users, thus enhancing the marketability of the device. In some embodiments, housing 202 may also serve as a handle for compact computing system 200, through exhaust lip 108 and the gap formed between air mover 320 and portion 110. In that regard, housing 202 allows a user to carry compact computing system 200 from one place to another. The round, omnidirectional format of housing 202 also allows the user to rotate compact computing system 200 in order to have interface panel 206 face a desired direction.

Figure 4B:
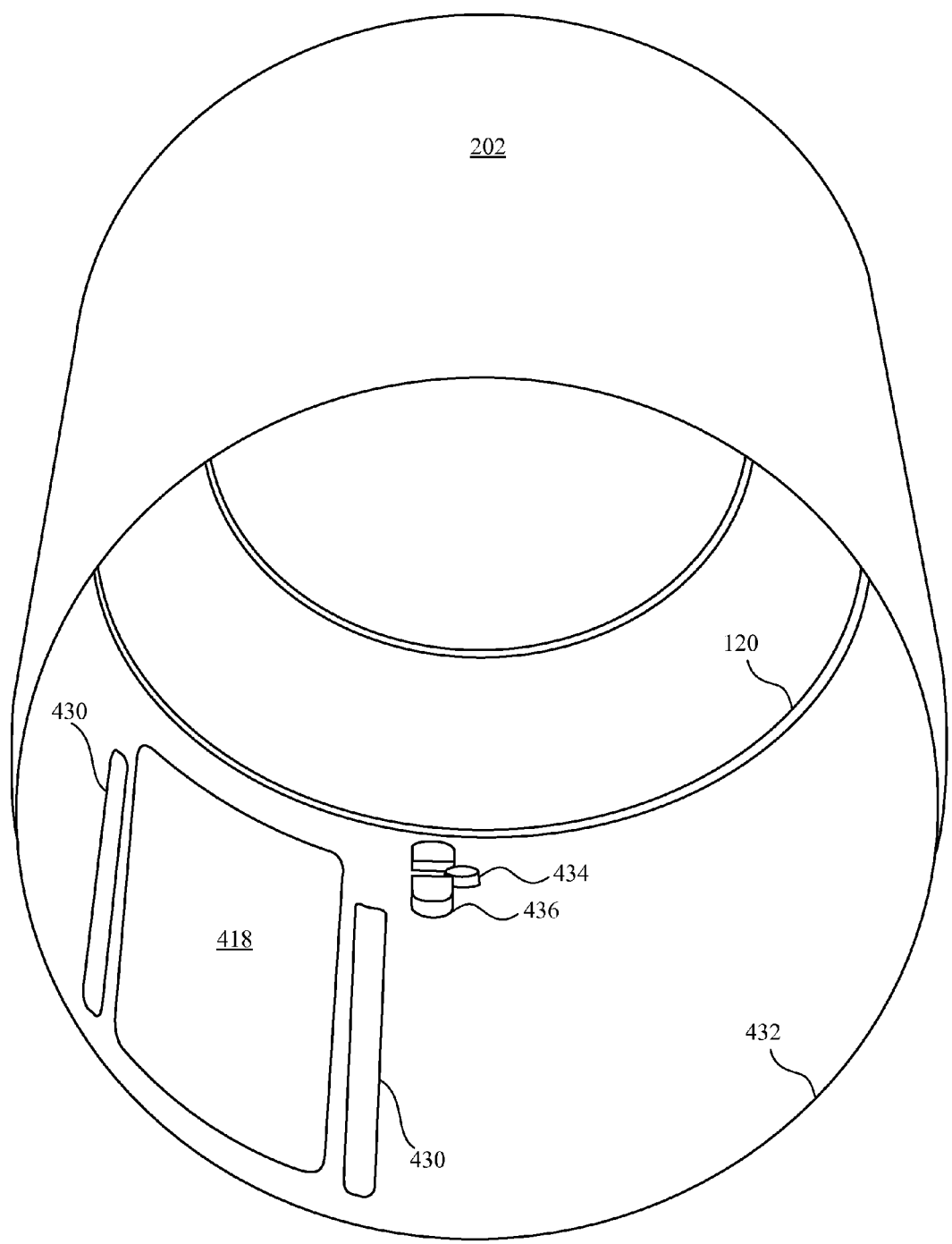
FIG. 4B shows a partial view of an internal portion of the housing for a compact computing system, according to some embodiments.

FIG. 4B shows a partial view of an internal portion of housing 202, according to some embodiments. The interior surface of housing 202 includes an anodized aluminum layer such that the outside surface of housing 202 is electrically insulated from circuitry inside central core 300. This enables the function of housing 202 as a Faraday cage for RF and EMI insulation of circuitry in central core 300. In some embodiments, a ground may be coupled between the outside surface of housing 202 and central core 300. Conductive stripes 430 may be laser etched on the anodized interior face of housing 202. Thus, stripes 430 reveal a bulk portion of the conductive layer forming housing 202. Conductive stripes 430 electrically couple touch points 328 to the conductive layer in housing 202, aiding in the formation of a Faraday cage providing RF and EMI insulation to circuitry in central core 300. FIG. 4B also illustrates bottom laser etched surface 432. Latch 434 is actuated by the user to fit into latch locking feature 436 so that latch 434 meets locking feature 436. By rotating housing 202 about central core 300, a user may find the proper orientation prior to 'dropping' housing 202 into a 'locked' position. In some embodiments, a Hall effect sensor identifies that housing 202 is in a locked position and enables the circuitry to be powered 'on'. It should be noted that an I/O illumination feature can activate (e.g., light up with illumination) even if housing 202 is not in a locked configuration. In some embodiments, sensors (such as an accelerometer) and I/O illumination circuitry can be active and operable regardless of whether housing 202 is in a locked configuration. In one embodiment, compact computing system 200 can be prevented from operating, or at least operating at full capacity, when housing 202 is not locked with respect to base 116.

Figure 4C:
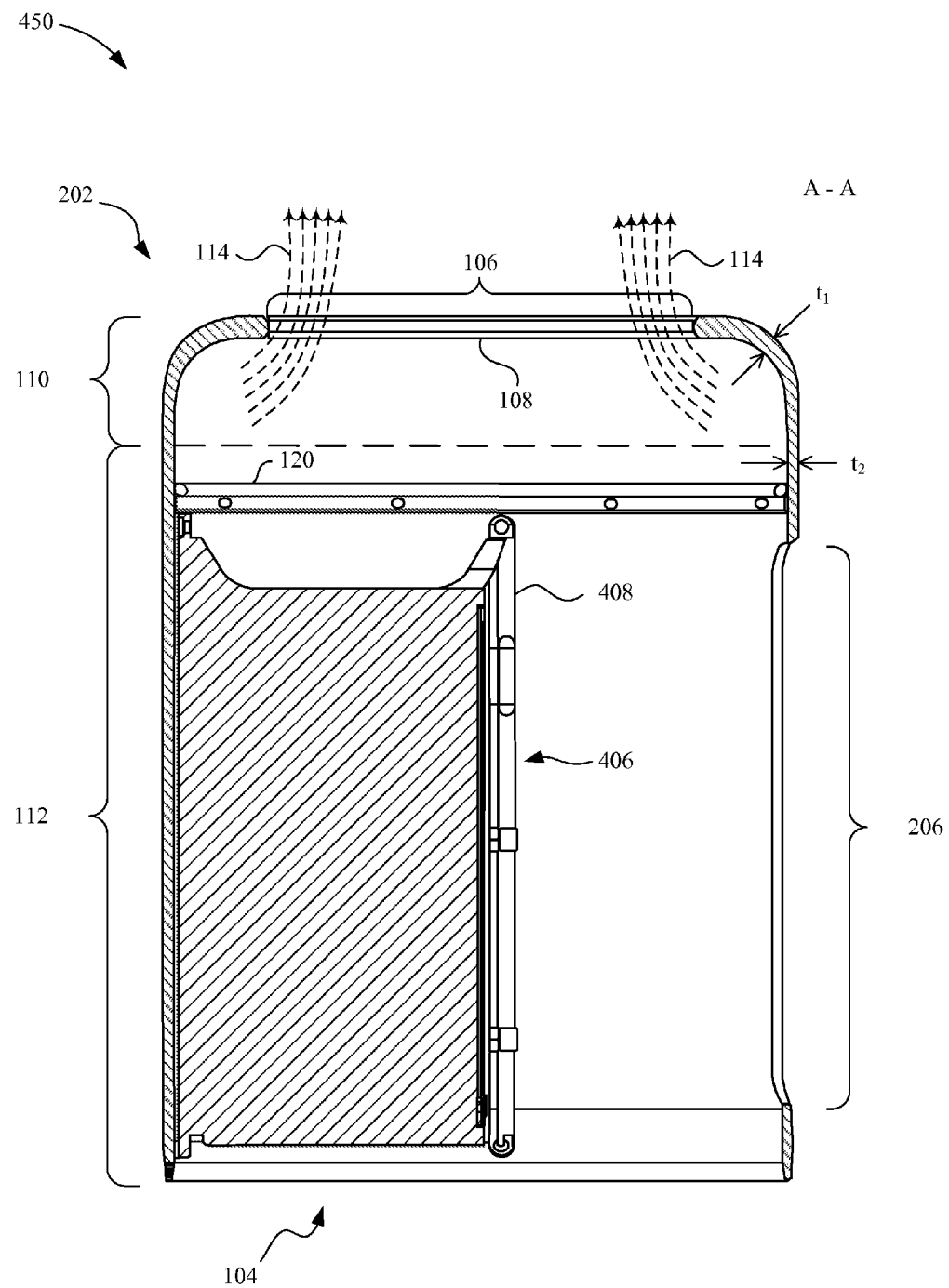
FIG. 4C shows a cross sectional view of a housing for a compact computing system, according to some embodiments.

FIG. 4C shows a cross sectional view 450 of housing 202 along line A-A of FIG. 4A for compact computing system 200. Portion 110, opening 106, exhaust lip 108, upper conductive gasket 120, opening 104, and heat sink 406 have been discussed in detail above. Accordingly, top portion 110 has a thickness $t_1$ that is greater than thickness $t_2$ of a portion 112 of housing 202. A thicker top portion 110 reduces the thermal impact on housing 202 by airflow 114 as it engages portion 110 by way of exhaust lip 108. In embodiments having housing 202 made of a thermally conductive material such as a metal (e.g., aluminum), a thicker layer of material increases the heat flow out of portion 110. FIG. 4C shows an illustrative example where thickness t gradually decreases from a maximum value $t_1$ at exhaust lip 108 down to a reduced value $t_2$ in portion 112.

Figure 5:
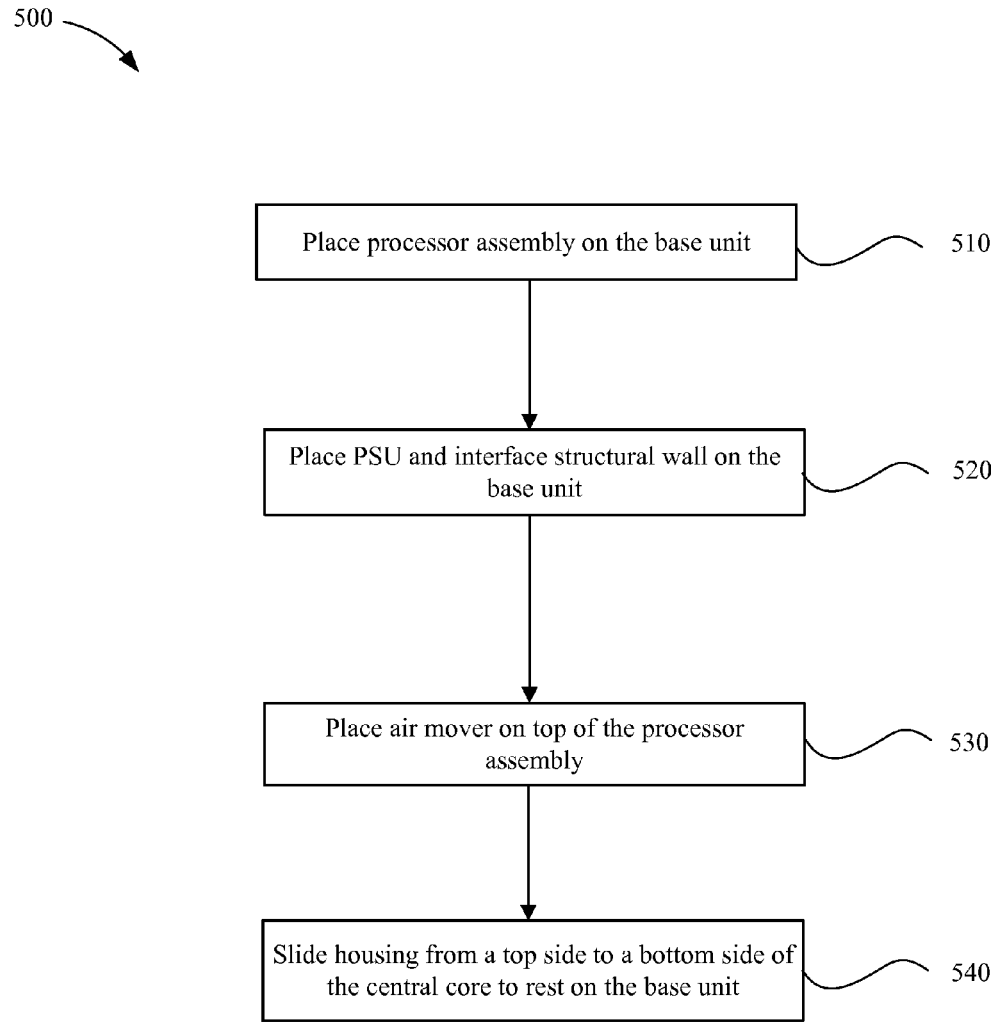
FIG. 5 shows a flowchart detailing a method for assembling a compact computing system inside a housing, in accordance with the described embodiments.

FIG. 5 shows a flowchart detailing a method 500 for assembling a compact computing system inside a housing, in accordance with the described embodiments. The compact computer may include a central core having a processor assembly, a base unit, and an air mover (central core 300, computing engine 402, base unit 116, and air mover 320, cf. FIGS. 3 and 4A). Also, a compact computing system in method 500 may include a PSU and an interface structural wall holding an interface panel (e.g., PSU 404, interface structural wall 418, and interface panel 206).

Step 510 includes placing the processor assembly on the base unit. Step 510 may include attaching fasteners to fixedly couple the processor assembly to the base unit. For example, some embodiments may include attaching screws onto bosses placed on the base unit. The screws may pass through holes formed in the processor assembly, thus fixedly coupling the processor assembly to the base unit. In that regard, step 510 may include passing a screw through a slot hole in a vertical member of the processor assembly (e.g., vertical member 408).

Step 520 includes placing the PSU and the interface structural wall on the base unit. The base unit may include a grooved portion along a top perimeter so that a lower edge of the interface structural wall fits in. Step 520 may include attaching fasteners to fixedly couple the PSU and the interface panel on the base unit. Accordingly, some embodiments may include using screws as fasteners.

Step 530 includes placing the air mover on top of the processor assembly. As in the previous steps, step 530 may include attaching fasteners to fixedly couple the air mover to the processor assembly. Thus, step 530 may include passing a screw through a slot hole in a vertical member of the processor assembly.

Step 540 includes sliding the housing from the topside to the bottom side of the central core to rest on the base unit. The sliding down in step 540 takes place smoothly because a gasket placed on a top interior portion of the housing (e.g., upper conductive gasket 122, cf. FIG. 1) contacts the upper edge of the central core when the housing travel is completed. Also, the sliding down in step 540 may include using the vertical members in the processor assembly as guiding lines. Step 540 provides a concentric configuration between the housing and different components in the central core. In some embodiments, step 540 may include slightly rotating the housing around the central core. The rotation allows finding a guiding lead for a latch guide so that a latch in the housing may engage a locking feature in the central core.

In a particular embodiment, a compact computing system can be assembled using a bottom up type assembly. Initial assembly operations can include installing a vapor chamber on each side of a triangular central core structure. In the described embodiments, the vapor chamber can take on the form of a two phase (vapor/solid) heat spreader. In a particular implementation, the core can take the form of an aluminum frame secured to and cradled within a fixture. High power components, such as a graphic processor unit (GPU) and/or central processor unit (CPU) can be mounted directly to the vapor chambers.

Figure 6B:
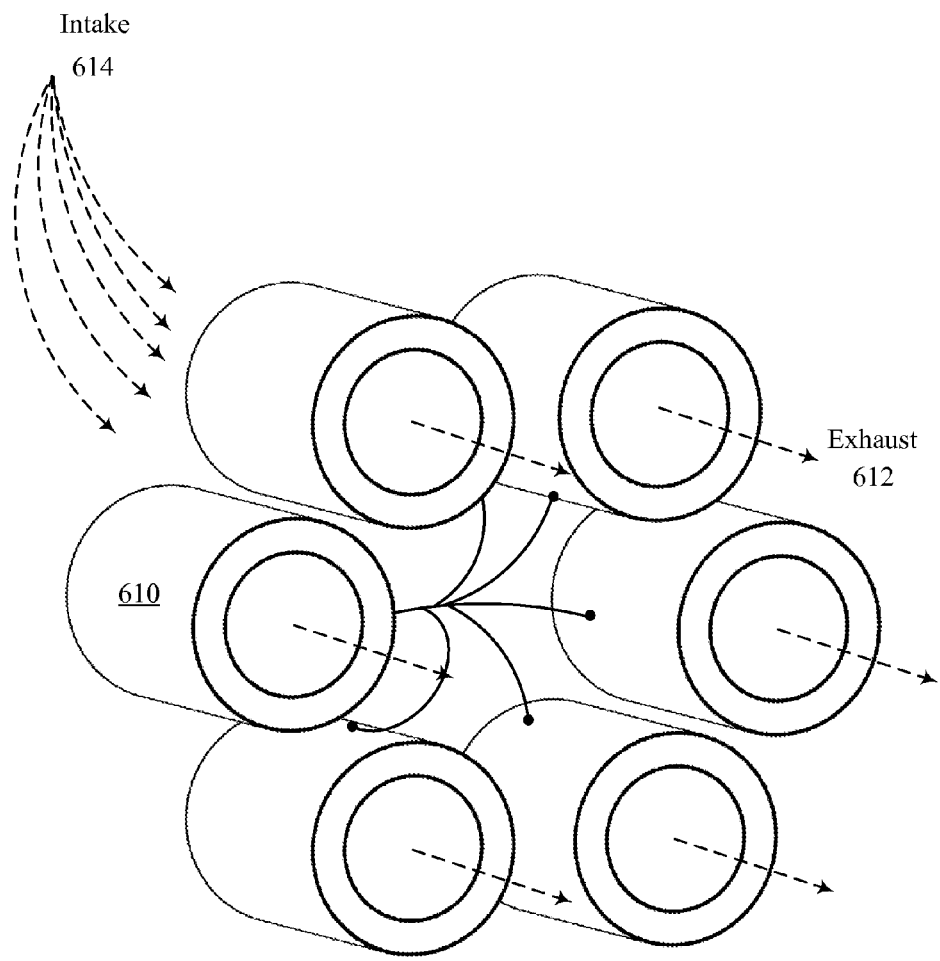
FIGS. 6B-6D shows various other rack arrangements suitable for supporting a number of compact computing systems.
Figure 6C:
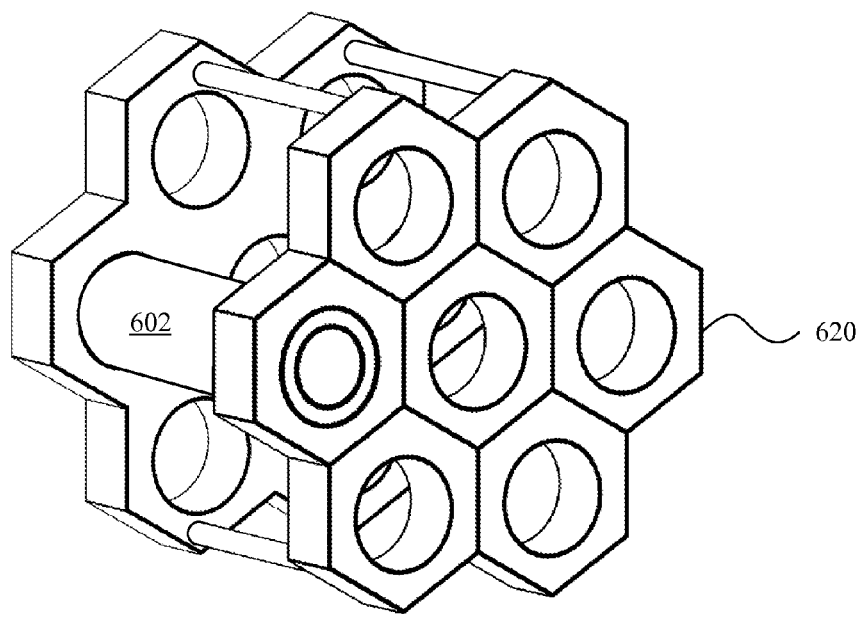
Figure 6D:
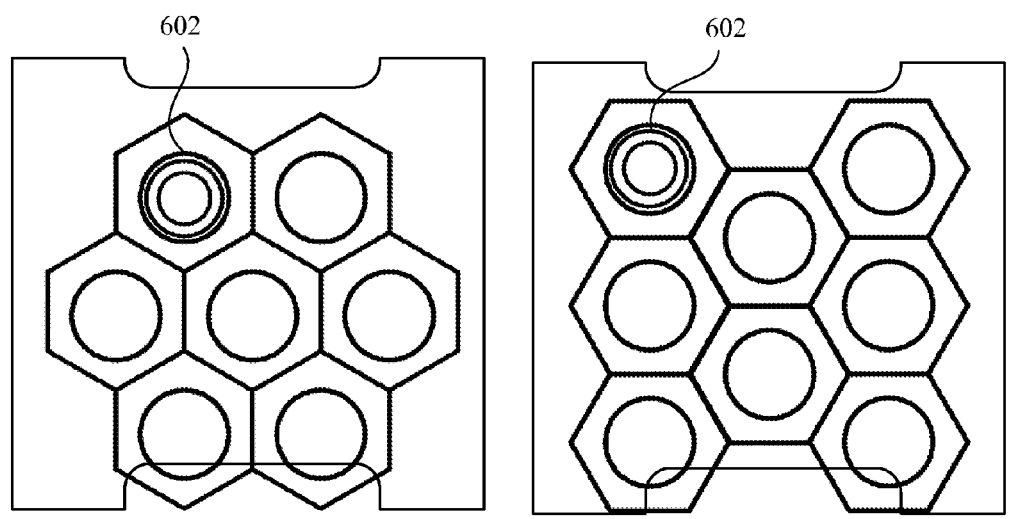

A good thermal contact can be formed between the vapor chambers and the high power components using a thermally conductive adhesive, paste, or other suitable mechanism. A main logic board (MLB) can be pressed against a CPU edge connector followed by installation of a GPU flex(es). Once the MLB is seated and connected to the CPU and GPU, memory modules can be installed after which an inlet assembly can be installed and coupled to the core structure using fasteners. An input/output (I/O) assembly that has been independently assembled and pre-tested can be installed after which a power supply unit (PSU) flex can be connected to the MLB followed by connecting the DC PSU power using a bus bar system. An exhaust assembly can be installed followed by connecting a RF antenna flex to an I/O assembly. Final assembly can include locking the assembly from top down FIG. 6A shows a multi-computing system arrangement 600 in accordance with the described embodiments. Arrangement 600 can include compact computing systems 602 in a stacked arrangement in rack 604. In this configuration, each of the compact computing systems can be interconnected with each other to form a network, for example, compact computing systems 602 can be oriented in any number of directions. As shown in FIG. 6A, compact computing systems 602 are arranged horizontally such that air intake/exhaust do not interfere with each other. In this depiction, cooling air can be pulled in on one side of rack arrangement 604 and exhausted on another side. In this way exhaust air from one compact computing system is not likely to be re-circulated into an intake of a nearby computing system. Compact computing systems 602 can be arranged in such a manner can also be in direct communication via data connectors 606. Data connectors 606 can be embodied by Ethernet cables, Thunderbolt® cables, or any number of other high speed data transfer protocol. In some embodiments the depicted compact computing systems can be in wireless communication. FIG. 6B shows a configuration in which a number of compact computing system are slaved to master compact computing system, thereby allowing the master compact computing system 610 to allocate resources of the various other compact computing systems. Moreover, air exhaust 612 from each of the compact computing systems 602 can be provided by single (or in some cases multiple) air intake 614. FIG. 6C shows various other arrangements compatible with the described compact computing systems. For example, "honey comb" rack 620 can be used to arrange compact computing systems 602 in a highly efficient close packed arrangement illustrated in various cross sections in FIG. 6D. A perspective view and cross sectional view of one embodiment are depicted showing a hexagonal arrangement of compact computing systems. In another arrangement the compact computing systems can be arranged in a linear arrangement.

Figure 7:
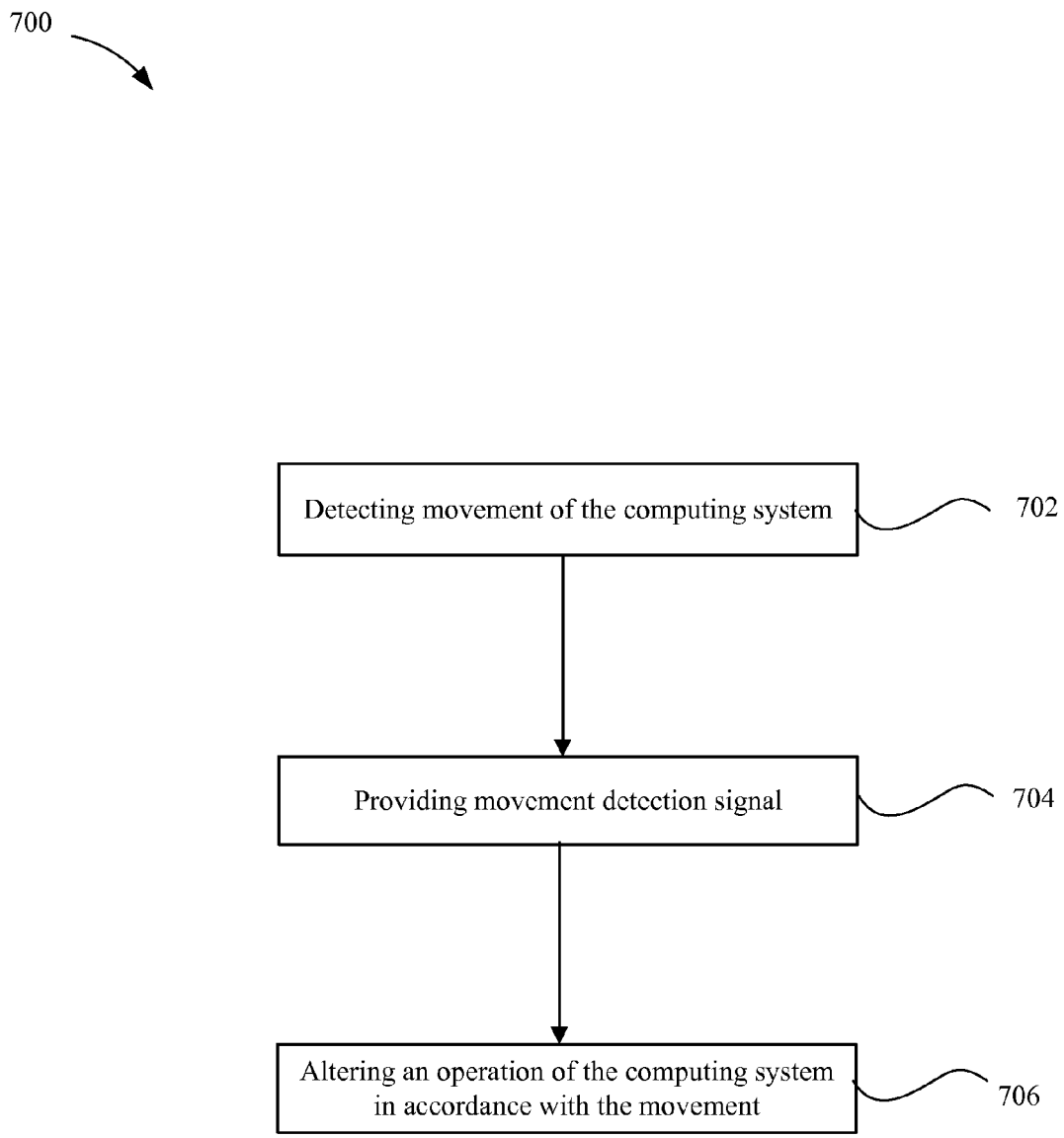
FIG. 7 is a flowchart detailing a process in accordance with the described embodiments.

FIG. 7 is a flowchart detailing a process in accordance with the described embodiments. Process 700 is carried out by detecting the movement of the desktop computing system by a sensor at 702 and at 704 providing a movement detection signal by the sensor to a processor in accordance with the movement and altering an operation of the desktop computing system in accordance with the movement at 706.

Figure 8:
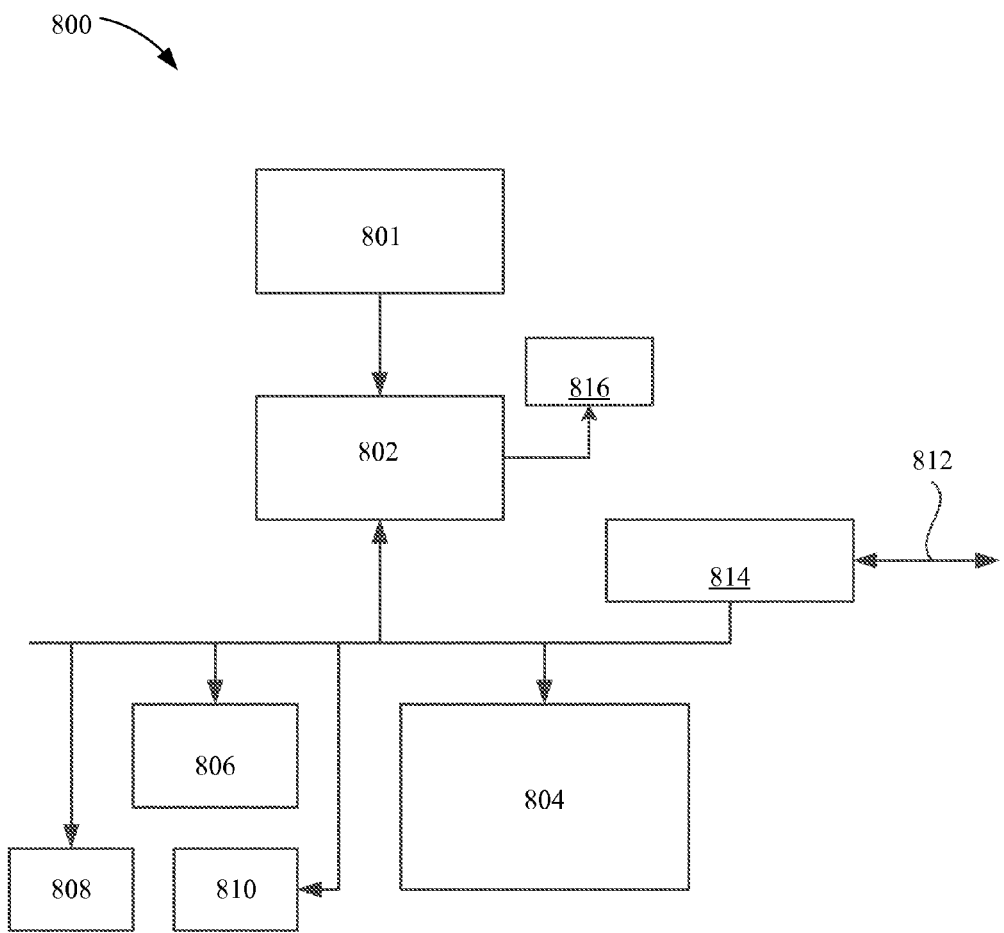
FIG. 8 is a block diagram of a computing system suitable for use with the described embodiments.

FIG. 8 is a block diagram of a computing system 800 suitable for use with the described embodiments. The computing system 800 illustrates circuitry of a representative computing system. The computing system 800 includes input device 801 coupled to a processor 802 that pertains to a microprocessor or controller for controlling the overall operation of the computing system 800. The computing system 800 stores data (such as media data) in a file system 804 and a cache 806. The file system 804 typically provides high capacity storage capability for the computing system 800. The cache 806 is, for example, Random-Access Memory (RAM) provided by semiconductor memory. The computing system 800 can also include a RAM 808 and a Read-Only Memory (ROM) 810. The ROM 810 can store programs, utilities or processes to be executed in a non-volatile manner.

The computing system 800 also includes a network/bus interface 814 that couples to a data link 812. The data link 812 allows the computing system 800 to couple to a host computer or to accessory devices. The data link 812 can be provided over a wired connection or a wireless connection. In the case of a wireless connection, the network/bus interface 814 can include a wireless transceiver. The media items (media data) can pertain to one or more different types of media content. In one embodiment, the media items are audio tracks (e.g., songs, audio books, and podcasts). In another embodiment, the media items are images (e.g., photos). However, in other embodiments, the media items can be any combination of audio, graphical or visual content. Sensor 816 can take the form of circuitry for detecting any number of stimuli. For example, sensor 816 can include a Hall Effect sensor responsive to external magnetic field, an audio sensor, a light sensor such as a photometer, and so on.

A desktop computing system includes a housing having a variable wall thickness and having a longitudinal axis that defines and encloses an internal volume that is symmetric about the longitudinal axis and a computational component positioned within the internal volume.

A computing system includes a housing having a longitudinal axis and that encloses and defines an internal volume that is symmetric about the longitudinal axis where the housing is formed of electrically conductive material, a computational component, and a base that supports the computational component and forms a conductive shell with the housing that electromagnetically isolates the computational component by blocking passage of electromagnetic (EM) energy.

An enclosure for a computer system includes a housing having a longitudinal axis that encloses an internal volume that is symmetric about the longitudinal axis and a cross section having a center point on the longitudinal axis.

An enclosure for a compact computing system having a computational component includes a cylindrical body that encloses a cylindrical volume having a longitudinal axis and comprises an electrically conductive material and a cylindrical shaped base attached to the cylindrical body in a closed configuration that electrically couples the base and the cylindrical body forming an electromagnetic (EM) shield that electromagnetically isolates the cylindrical volume.

An enclosure for a desktop computing system having a computational component, includes a body that encloses an internal volume formed of an electrically conductive material, a base unit, and a sensible element that is detectable by a sensing mechanism coupled to the computational component, wherein the detectability of the sensible element by the sensing mechanism corresponds to a state of the enclosure.

A desktop computing system includes a housing having a longitudinal axis that encloses an internal volume that is symmetric about the longitudinal axis, a heat sink that encloses at least a central thermal zone that is substantially parallel to the longitudinal axis and having a cross section having a shape of a polygon, and a computing engine comprising a computational component disposed within the internal volume and carried by and in thermal contact with the heat sink.

An enclosure for a desktop computer system includes a cylindrical body having a longitudinal axis formed of electrically conductive material that encloses and defines a cylindrical volume having a circular cross section comprising a center point positioned on the longitudinal axis.

An enclosure for a compact computing system having a computational component includes a body that encloses and defines a cylindrical volume and comprises an electrically conductive material and a base having a size and shape in accordance with and attached to the cylindrical body in a closed configuration that electrically couples the base and the cylindrical body forming an electromagnetic (EM) shield that electromagnetically isolates the cylindrical volume.

A cylindrical desktop computing system having a computational component includes a cylindrical housing having a longitudinal axis that encloses and defines a cylindrical volume that is symmetric about the longitudinal axis.

A cylindrical desktop computing system includes a cylindrical housing that defines a cylindrical volume having a longitudinal axis and a computational component positioned within the cylindrical volume. The cylindrical desktop computing system includes a housing wall having a varying housing wall thickness where the cylindrical housing wall thickness comprises a first thickness at a first end of the cylindrical housing such that the cylindrical housing wall thickness comprises a second thickness at a second end of the cylindrical housing where the first thickness value is less than the second thickness value. In an embodiment, the cylindrical housing comprising a first opening at the first end and a second opening at the second end opposite the first end and the first opening is circular having a first diameter and second opening is circular having a second diameter where second diameter is greater than the first diameter. In an embodiment, the computational component transfers heat to air from the first opening that is moving through the cylindrical volume and the air moves through the cylindrical volume generally parallel to the longitudinal axis and the heated air passes out of the cylindrical volume through the second opening and some of the thermal energy of the heated air is transferred to the cylindrical housing at the second opening.

In an embodiment, the change in cylindrical housing wall thickness promotes circumferential and axial diffusion of the thermal energy In an embodiment, the circumferential and axial diffusion of the thermal energy inhibits formation of thermal hot spots in the housing the heated air has a reduced acoustic signature at the second opening. In one embodiment, the computational component has a shape having a major centerline corresponding to a major dimension and a minor centerline corresponding to a minor dimension. In one embodiment, the major dimension corresponding to a major length and the minor dimension corresponds to a minor length. In one embodiment, the major dimension is a length (L) and the minor dimension is a width. In one embodiment, the major dimension is generally parallel to the longitudinal axis. In one embodiment, the minor dimension is generally parallel to the longitudinal axis. In an embodiment, a heat sink having planar faces at least one of which is generally parallel to the longitudinal axis, the planar faces defining a central region where the central region has a triangular cross section. In an embodiment, an inside surface of the cylindrical housing and an exterior surface of at least one of the planar faces form a peripheral region spaced apart from the triangular central region. In an embodiment, the computational component is mounted to one of the planar faces. In an embodiment, the cylindrical housing is formed of aluminum.

A computing system includes a cylindrical housing formed of electrically conductive material that defines a cylindrical volume, a computational component within the cylindrical volume, and a cylindrical base that supports the computational component and forms a conductive shell in combination with the cylindrical housing that electromagnetically isolates the computational component by blocking passage of electromagnetic (EM) energy.

In an embodiment, the cylindrical base comprises a pedestal configured to support the computing system in a vertical orientation and a vent system that allows an intake air flow into the cylindrical volume and inhibits the passage of EM energy. In an embodiment, the vent system includes vents that can be spaced apart along a circumference of the cylindrical base. In an embodiment, at least some of the vents are spaced apart in a manner that inhibits the passage of EM energy. In an embodiment, at least one of the vents is angled with respect to the cylindrical base in an manner that inhibits a reduction of the intake airflow regardless of a spatial orientation of the computing system. In an embodiment, the housing comprises a housing wall formed of thermally conductive material having a tuned thickness that inhibits formation of thermal hotspots in the housing by promoting circumferential and axial conduction of thermal energy. In an embodiment, the computing system further includes an electrical connector configured to electrically connect the computational component to an external circuit the external circuit is part of a second computing system. In an embodiment, the second computing system has a spatial orientation different than that of the computing system. In an embodiment, the second computing system is not vertically supported by the pedestal. In an embodiment, the second computing system is rack mounted.

An enclosure for a cylindrical computer system includes a cylindrical housing that defines a cylindrical volume having a longitudinal axis and a circular cross section having a center point corresponding to a position on the longitudinal axis and a wall having a wall thickness that varies in accordance with the position of the center point on the longitudinal axis.

In an embodiment, the circular cross section further comprising a radius having a radial length, the radius being perpendicular to the longitudinal axis and the radial length varies in accordance with the position of the center point of the circular cross section on longitudinal axis. In an embodiment, the system includes an inner radius having a first radial length that defines in part an interior surface of the cylindrical housing. In an embodiment, the circular cross section includes an outer radius having a second radial length greater than the first radial length that defines in part an exterior surface of the cylindrical housing.

In an embodiment, the wall thickness corresponds to a difference between the outer radial length and the inner radial length. In an embodiment, the inner radius length is a constant value. In an embodiment, wherein the cylindrical housing is electrically and thermally conductive. In an embodiment, the varying wall thickness promotes axial and circumferential heat transfer within the cylindrical housing. In an embodiment, the axial and circumferential heat transfer inhibits formation of thermal hot spots in the cylindrical housing. In an embodiment, the cylindrical housing comprises a first opening at a first end of the cylindrical housing having a first diameter and a second opening at a top end opposite the first end having a second diameter. In an embodiment, the second diameter is less than the first diameter. In an embodiment, the cylindrical housing wall thickness varies from a first thickness value near the first opening and a top thickness value near the second opening. In an embodiment, the first thickness value is less than the top thickness value. In an embodiment, the system includes a base unit at the first end of the cylindrical housing comprising a support element that provides support for the computing system. In an embodiment, in a closed configuration, the base unit and the cylindrical housing cooperate to electromagnetically isolate the cylindrical volume. In an embodiment, the cooperation comprises forming a Faraday cage by electrically coupling the cylindrical housing and the base unit. In an embodiment, the cylindrical housing is formed of aluminum.

An enclosure for a compact computing system having a computational component is described. In one embodiment, the enclosure has a cylindrical body that defines and encloses a cylindrical volume and includes a wall formed of an electrically conductive material and a cylindrical shaped base attached to the cylindrical body. In a closed configuration the base and the cylindrical body are coupled together forming an electromagnetic (EM) shield that electromagnetically isolates the cylindrical volume.

In an embodiment, the cylindrical body has a circular cross section and includes a first circular opening having a first diameter at a first end and a second circular opening having a second diameter at a second end. In an embodiment, the cylindrical body further includes an electrically conductive seal at the first end. In an embodiment, in the closed configuration the electrically conductive seal creates an electrically conducting path between the cylindrical body and the base. In an embodiment, the base includes a pedestal configured to support the enclosure and an opening having a size and shape configured to allow passage of air and inhibit passage of EM energy where the pedestal supports the enclosure in a vertical orientation on a horizontal surface. In an embodiment, the opening includes at least a vent positioned about a circumference of the cylindrically shaped base in a manner that provides for the passage of the air and that inhibits the passage of the EM energy.

In an embodiment, a sensing element within the cylindrical volume configured to detect a state of the enclosure, the sensing element being coupled to the computational component where the state of the enclosure comprises a configuration of the enclosure with respect to the base and the sensing element sends a configuration signal to the computational component. In an embodiment, the configuration signal causes the computational component to operate in a corresponding operating state. In an embodiment, the operating state is a fully operational state only when the configuration signal corresponds to the closed configuration in which the base and cylindrical body are attached to each other. In an embodiment, the body further includes a magnetic element that provides a magnetic field detectable by the sensing element.

In an embodiment, the closed configuration corresponds to the sensing element detecting the magnetic field having a pre-determined magnetic field strength. In an embodiment, the state of the enclosure corresponds to motion of the enclosure with respect to a reference frame detectable by the sensing element. In an embodiment, the sensing element sends a motion detection signal to the computational component when the motion of the enclosure with respect to the reference frame is detected. In an embodiment, the computational component responds to the motion detection signal by providing an indication of the detected motion. In an embodiment, the indication is an optical indication.

A method of indicating movement of a desktop computing system by detecting the movement of the desktop computing system by a sensor, providing a movement detection signal by the sensor to a processor in accordance with the movement and altering an operation of the desktop computing system in accordance with the movement. The movement includes at least one of a rotational movement and a translational movement. In one embodiment, altering the operation of the desktop computing system includes providing an indication of the movement. In one embodiment, the indication of the movement is an visual notification. In one embodiment, the visual notification comprises: illuminating an I/O port in accordance with an illumination pattern. In one embodiment, the method includes providing an illumination control signal by the processor in response to the movement detection signal to an I/O interface panel having a light emitting diode (LED. In one embodiment, the method includes light provided by the LED in response to the illumination control signal, receiving at least some of the light generated by the LED by a grouping light guide adjacent to the plurality of I/O ports that guides some of the received light through an opening of an opaque layer on an outer surface of the I/O interface panel, illuminating the I/O port using at least some of the guided light indicating the movement of the desktop computing system. In one embodiment, a first portion of the I/O interface panel is adjacent the grouping light guide and is at least partially transparent to the light. In one embodiment, a second portion of the I/O interface panel adjacent the first portion of the interface panel and adjacent to the at least one I/O port is opaque to the light.

A network system includes at least two interconnected computing systems having a cylindrical shape characterized as having a longitudinal axis and each having a thermal management system connected together in a manner that allows the thermal management system of each computing system to maintain a pre-determined thermal performance of each computing system within an operating limit during operation. In one embodiment, the longitudinal axes of the interconnected computing systems are perpendicular to each other.

In one embodiment, the longitudinal axes of the interconnected computing systems are aligned to each other. In one embodiment, the longitudinal axes of the interconnected computing systems are perpendicular to each other. In one embodiment, the longitudinal axes of the interconnected computing systems are aligned to each other. In one embodiment, the longitudinal axes of the interconnected computing systems are aligned to each other and generally parallel to a horizontal support surface. In one embodiment, the longitudinal axes of the interconnected computing systems are aligned to each other and generally parallel to a horizontal support surface.

An enclosure for a desktop computing system having a computational component includes a cylindrical body that encloses a cylindrical volume and comprises a wall formed of an electrically conductive material, a base unit; and a sensible element that is detectable by a sensing mechanism coupled to the computational component, wherein the detectability of the sensible element by the sensing mechanism corresponds to a state of the enclosure.

A desktop computing system includes a cylindrical housing that encloses a cylindrical volume having a longitudinal axis, a heat sink that encloses at least a central thermal zone that is substantially parallel to the longitudinal axis and having a triangular cross section, and a computing engine comprising a computational component disposed within the cylindrical volume and carried by and in thermal contact with the heat sink.

An enclosure for a desktop computer system includes a cylindrical body formed of electrically conductive material that encloses and defines a cylindrical volume having a longitudinal axis and a circular cross section comprising a center point positioned on the longitudinal axis.

An enclosure for a desktop computing system having a computational component, includes a body that encloses an internal volume formed of an electrically conductive material, a base unit, and a sensible element that is detectable by a sensing mechanism coupled to the computational component, wherein the detectability of the sensible element by the sensing mechanism corresponds to a state of the enclosure.

A desktop computing system includes a housing having a longitudinal axis that encloses an internal volume that is symmetric about the longitudinal axis, a heat sink that encloses at least a central thermal zone that is substantially parallel to the longitudinal axis, and a computing engine comprising a computational component disposed within the internal volume and carried by and in thermal contact with the heat sink.

An enclosure for a desktop computer system includes a cylindrical body having a longitudinal axis formed of electrically conductive material that encloses and defines a cylindrical volume having a circular cross section comprising a center point positioned on the longitudinal axis.

An enclosure for a compact computing system having a computational component includes a body that encloses and defines a cylindrical volume and comprises an electrically conductive material and a base having a size and shape in accordance with and attached to the cylindrical body in a closed configuration that electrically couples the base and the cylindrical body forming an electromagnetic (EM) shield that electromagnetically isolates the cylindrical volume.

A desktop computing system having a computational component includes a cylindrical housing having a longitudinal axis that encloses and defines a cylindrical volume that is symmetric about the longitudinal axis.

The various aspects, embodiments, implementations or features of the described embodiments can be used separately or in any combination. Various aspects of the described embodiments can be implemented by software, hardware or a combination of hardware and software. Aspects of the described embodiments can also be embodied as computer readable code on a computer readable medium. In some embodiments, the computer readable code can be used to manufacture and/or assembly for controlling manufacturing operations or as computer readable code on a computer readable medium for controlling a manufacturing line. The computer readable medium is any data storage device that can store data that can thereafter be read by a computer system.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

The embodiments were chosen and described in order to best explain the principles of the invention and its practical applications, to thereby enable others skilled in the art to best utilize the invention and various embodiments with various modifications as are suited to the particular use contemplated.

It is intended that the scope of the invention be defined by the following claims and their equivalents.

While the embodiments have been described in terms of several particular embodiments, there are alterations, permutations, and equivalents, which fall within the scope of these general concepts. It should also be noted that there are many alternative ways of implementing the methods and apparatuses of the present embodiments. It is therefore intended that the following appended claims be interpreted as including all such alterations, permutations, and equivalents as fall within the true spirit and scope of the described embodiments.

What is claimed is:

1. A desktop computing system, comprising:
   a housing having a longitudinal axis and a circular cross section that is perpendicular to the longitudinal axis and that defines and encloses an internal volume that is symmetric about the longitudinal axis and having a wall having a wall thickness that varies smoothly from a first thickness to a reduced thickness;
   a heat sink having at least three planar walls at least one of which is generally parallel to the longitudinal axis, the at least three planar walls enclose and define a central region having a polygonal cross section that is perpendicular to the longitudinal axis; and
   a computational component positioned within the internal volume and supported by and in thermal contact with the heat sink.

2. The desktop computing system as recited in claim 1, wherein the computational component comprises a shape defined in part by a major dimension corresponding to a major length and a minor dimension corresponding to a minor length, the major dimension being generally parallel to the longitudinal axis.

3. The desktop computing system as recited in claim 1, wherein an inside surface of the housing wall and an exterior surface of at least one of the planar walls form a peripheral region spaced apart from the central region.

4. The desktop computing system as recited in claim 1, wherein the housing is cylindrical and wherein the internal volume comprises a circular cross section that is perpendicular to the longitudinal axis.

5. The desktop computing system as recited in claim 1, wherein the polygonal cross section comprises n-sides, wherein n is an integer having a value of at least 3.

6. The desktop computing system as recited in claim 1, wherein the wall thickness varies smoothly in accordance with the longitudinal axis from the first thickness to the reduced thickness.

7. The desktop computing system as recited in claim 6, the housing further comprising a first opening at the first end having a first area and a second opening at the second end having a second area that is less than the first area.

8. The desktop computing system as recited in claim 7, wherein the computational component transfers heat to an amount of air entering from the first opening that moves through the internal volume generally parallel to the longitudinal axis.

9. The desktop computing system as recited in claim 1, wherein the variable wall thickness promotes a uniform diffusion of thermal energy in the housing that inhibits formation of a localized thermal hot spot in the housing.

10. The desktop computing system as recited in claim 1, the heat sink further comprising a cooling fin that extends across the central region from an interior surface of a first wall to an interior surface of at least a second wall.

11. The desktop computing system as recited in claim 10, wherein the desktop computing system is operable when mounted horizontally on a horizontal support surface.

12. The desktop computing system as recited in claim 11, wherein the horizontal support surface comprises a horizontally configured rack.

13. The desktop computing system as recited in claim 12, wherein the horizontally rack mounted desktop computing system is directly connectable to at least another horizontally rack mounted desktop computing system.

14. A desktop computing system, comprising:
    a housing having a longitudinal axis and that encloses an internal volume that is symmetric about the longitudinal axis, the housing further comprising a housing wall having a wall thickness that varies smoothly from a first thickness to a reduced thickness in accordance with the longitudinal axis;
    a heat sink comprising three planar walls that enclose a central thermal zone that is substantially parallel to the longitudinal axis and having a triangular cross section perpendicular to the longitudinal axis; and
    a computing engine comprising a computational component disposed within the internal volume and carried by and in thermal contact with the heat sink.

15. The desktop computing system as recited in claim 14, wherein the computing engine has a form factor corresponding to that of the heat sink.

16. The desktop computing system as recited in claim 14, wherein the housing is cylindrical and wherein the internal volume comprises a circular cross section that is perpendicular to the longitudinal axis.

17. The desktop computing system as recited in claim 14, wherein the computational component comprises a major dimension and is carried by the heat sink such that the major dimension is generally parallel to the longitudinal axis.

18. The desktop computing system as recited in claim 14, wherein the computational component comprises a minor dimension and is carried by the heat sink such that the minor dimension is generally parallel to the longitudinal axis.

19. The desktop computing system as recited in claim 14, wherein the heat sink further comprises:
    a cooling fin that extends across the central thermal zone from an interior surface of a first wall to an interior surface of at least a second wall.

20. A desktop computing system having a computational component, comprising:
    a cylindrical housing having a longitudinal axis and that encloses and defines an internal volume that is symmetric about the longitudinal axis and comprising a housing wall having a wall thickness that varies smoothly in accordance with the longitudinal axis from a first thickness to a reduced thickness; and
    a heat sink having at least three planar walls at least one of which is generally parallel to the longitudinal axis and that define a central region having a polygonal cross section.

21. The desktop computing system as recited in claim 20, wherein an inside surface of the housing and an exterior surface of at least one of the planar walls form a peripheral region spaced apart from the central region.

* * * * *

UNITED STATES PATENT AND TRADEMARK OFFICE
CERTIFICATE OF CORRECTION

| | | |
|---|---|---|
| PATENT NO. | : 9,176,548 B2 | Page 1 of 1 |
| APPLICATION NO. | : 14/297572 | |
| DATED | : November 3, 2015 | |
| INVENTOR(S) | : Brett W. Degner et al. | |

It is certified that error appears in the above-identified patent and that said Letters Patent is hereby corrected as shown below:

On the Title Page, Item (54) and in the Specification, column 1, line 1: "COMPUTER SYSTEM" should read -- COMPUTER SYSTEM INCLUDING WALLS WITH VARYING THICKNESS --.

Signed and Sealed this
Eighth Day of March, 2016

Michelle K. Lee
*Director of the United States Patent and Trademark Office*